(12) United States Patent
Höppel

(10) Patent No.: US 10,573,787 B2
(45) Date of Patent: Feb. 25, 2020

(54) LIGHT-EMITTING SEMICONDUCTOR CHIP AND METHOD FOR PRODUCING A LIGHT-EMITTING SEMICONDUCTOR CHIP

(71) Applicant: OSRAM Opto Semiconductors GmbH, Regensburg (DE)

(72) Inventor: Lutz Höppel, Alteglofsheim (DE)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 0 days.

(21) Appl. No.: 16/081,159

(22) PCT Filed: Mar. 15, 2017

(86) PCT No.: PCT/EP2017/056153
§ 371 (c)(1),
(2) Date: Aug. 30, 2018

(87) PCT Pub. No.: WO2017/158046
PCT Pub. Date: Sep. 21, 2017

(65) Prior Publication Data
US 2019/0019921 A1     Jan. 17, 2019

(30) Foreign Application Priority Data

Mar. 17, 2016    (DE) .................. 10 2016 104 965

(51) Int. Cl.
*H01L 33/46* (2010.01)
*H01L 33/40* (2010.01)
*H01L 33/20* (2010.01)

(52) U.S. Cl.
CPC ............ *H01L 33/46* (2013.01); *H01L 33/405* (2013.01); *H01L 33/20* (2013.01)

(58) Field of Classification Search
None
See application file for complete search history.

(56) References Cited

U.S. PATENT DOCUMENTS 6,504,180 B1 * 1/2003 Heremans ............ G02B 6/4249
257/88
7,691,659 B2   4/2010 Bader et al.
(Continued)

FOREIGN PATENT DOCUMENTS

| DE | 102008035900 A1 | 11/2009 |
| DE | 102009018603 A1 | 2/2010 |
| EP | 1277240 B1 | 1/2003 |

OTHER PUBLICATIONS

Kuo, S.Y. et al., "Enhanced Light Output of UVA GaN Vertical LEDs with Novel DBR Mirrors," IEEE Journal of Quantum Electronics, vol. 51, No. 12, Dec. 2015, 5 pages.

*Primary Examiner* — Reema Patel
*Assistant Examiner* — Steven M Christopher
(74) *Attorney, Agent, or Firm* — Slater Matsil, LLP

(57) ABSTRACT

A light-emitting semiconductor chip and a method for producing a light-emitting semiconductor chip are disclosed. In an embodiment a light-emitting chip includes a semiconductor body having an active region designed to generate light, a dielectric mirror including an electrically insulating material and a first metallic mirror including an electrically conductive material, wherein the semiconductor body expands towards a light exit side, wherein the dielectric mirror is arranged on a side of the semiconductor body facing away from the light exit side, wherein the first metallic mirror is arranged on a side of the dielectric mirror facing away from the semiconductor body, wherein the first metallic mirror electrically contacts the semiconductor body through at least one opening in the dielectric mirror, and wherein the dielectric mirror, apart from the at least one opening, completely covers the semiconductor body on the side facing away from the light exit side.

10 Claims, 21 Drawing Sheets

(56) References Cited

U.S. PATENT DOCUMENTS

| | | |
|---|---|---|
| 7,968,355 B2 | 6/2011 | Kim |
| 8,530,923 B2 | 9/2013 | Sabathil et al. |
| 2007/0114552 A1 | 5/2007 | Jang et al. |
| 2009/0267096 A1 | 10/2009 | Kim |
| 2011/0272724 A1 | 11/2011 | Tsai et al. |
| 2013/0140598 A1* | 6/2013 | Hoppel ............... H01L 33/40 257/98 |
| 2014/0367717 A1 | 12/2014 | Freund et al. |

* cited by examiner

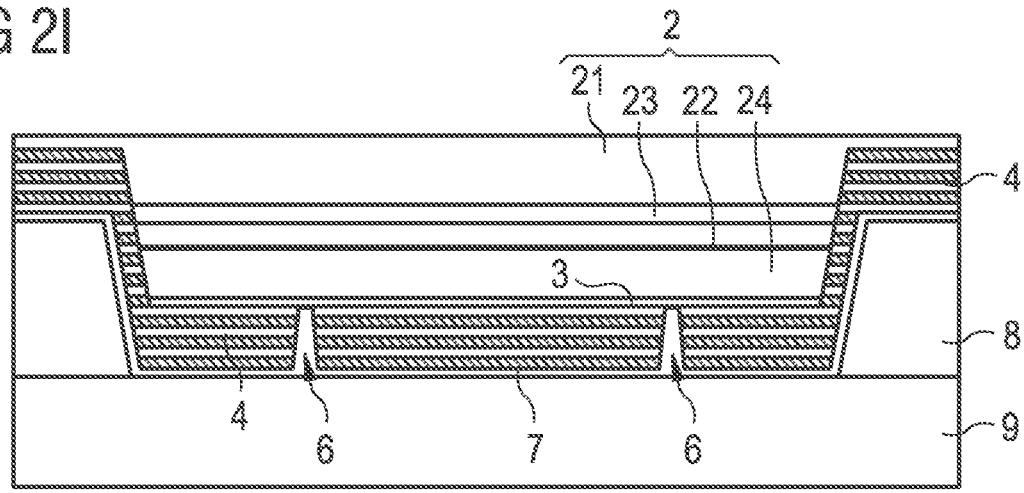
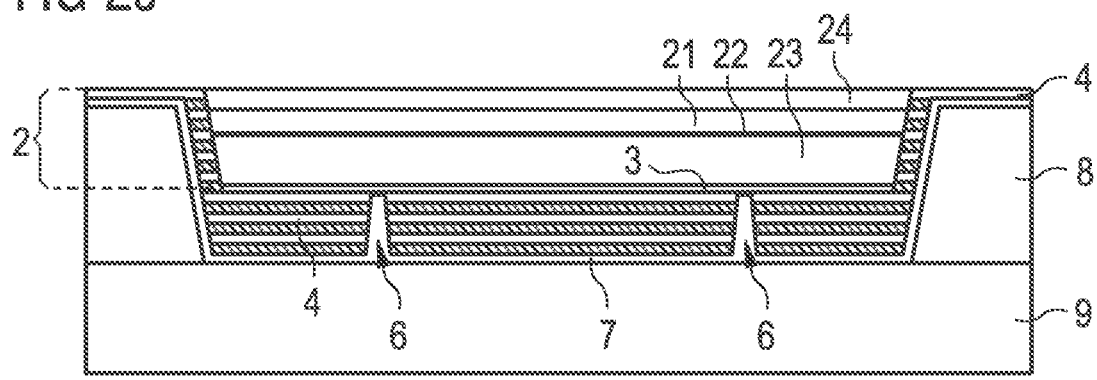
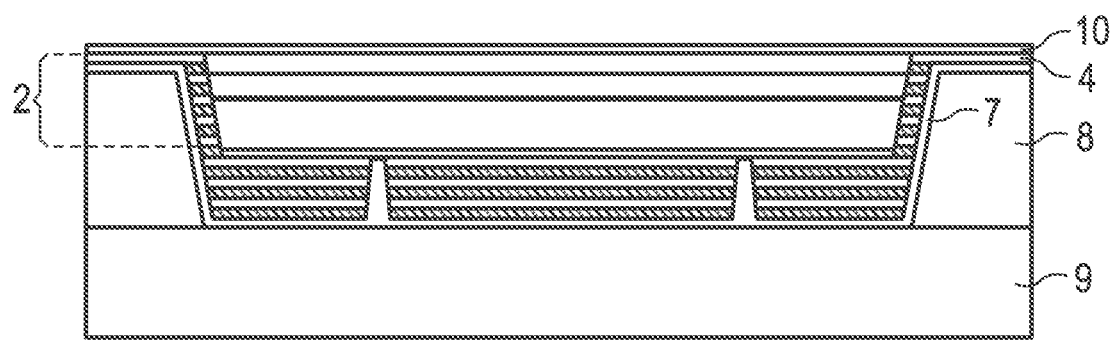

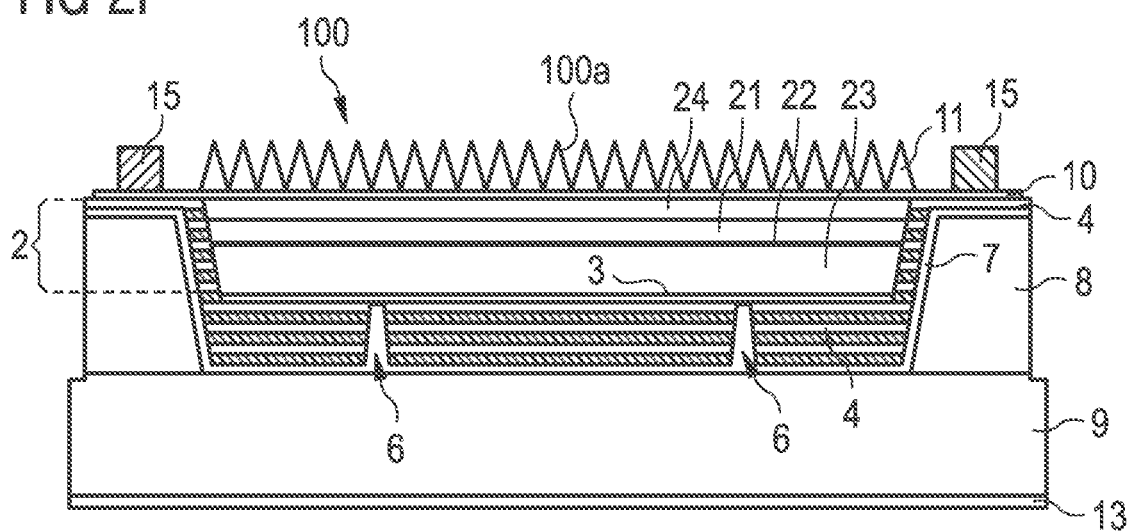

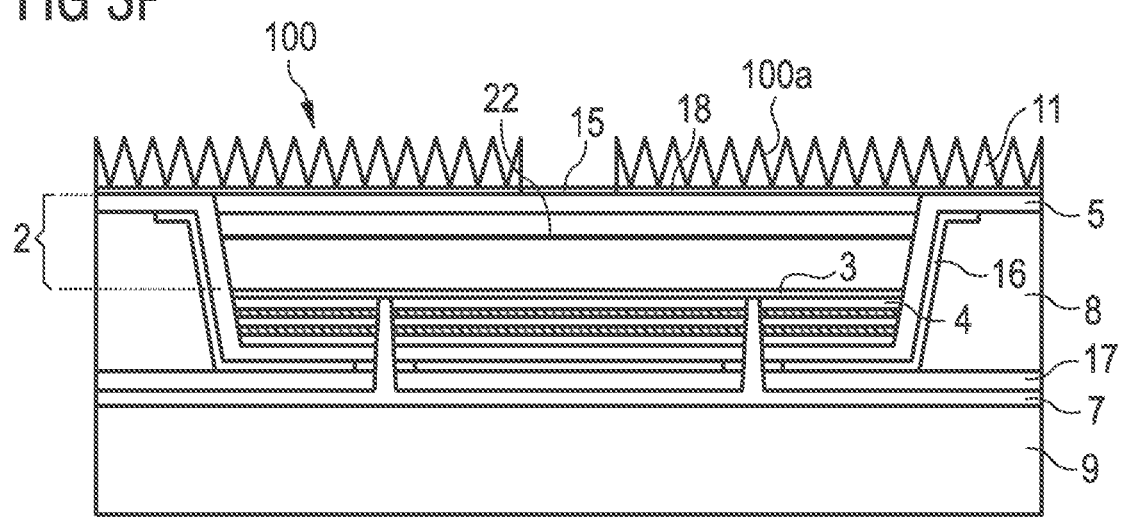

United States Patent US 10,573,787 B2

LIGHT-EMITTING SEMICONDUCTOR CHIP AND METHOD FOR PRODUCING A LIGHT-EMITTING SEMICONDUCTOR CHIP

This patent application is a national phase filing under section 371 of PCT/EP2017/056153, filed Mar. 15, 2017, which claims the priority of German patent application 10 2016 104 965.4, filed Mar. 17, 2016, each of which is incorporated herein by reference in its entirety.

TECHNICAL FIELD

European Patent EP 1277240 B1 describes a light-emitting semiconductor chip and a method for producing a light-emitting semiconductor chip.

SUMMARY OF THE INVENTION

Embodiments provide a light-emitting semiconductor chip which is particularly resistant to corrosion. Further embodiments provide a method for producing such a light-emitting semiconductor chip, which can be carried out particularly cost-effectively.

A light-emitting semiconductor chip is specified. The light-emitting semiconductor chip is, for example, a light-emitting diode, such as a laser diode, or a light-emitting diode. The light-emitting semiconductor chip emits light during operation. In this context, light is understood to mean electromagnetic radiation in the spectral range between UV radiation and infrared radiation. In particular, the light-emitting semiconductor chip can be designed, for example, to produce light with a wavelength of at least 450 nm, typically 470 nm and more, in particular blue or green light, during operation.

According to at least one embodiment of the light-emitting semiconductor chip, the light-emitting semiconductor chip comprises a semiconductor body. The semiconductor body comprises a plurality of regions, which may be epitaxially deposited on each other, for example. In particular, the semiconductor body comprises at least one active region which is designed to generate light. This means, during operation of the semiconductor chip, the light is generated in the active region, which at least partially leaves the semiconductor chip and is emitted by the latter.

According to at least one embodiment of the light-emitting semiconductor chip, the light-emitting semiconductor chip comprises a dielectric mirror that is formed with an electrically insulating material. The dielectric mirror may, for example, be a so-called Bragg mirror. The dielectric mirror then comprises a plurality of first mirror layers and of second mirror layers, wherein the first mirror layers and the second mirror layers differ from one another with respect to their refractive index. Furthermore, the first and second mirror layers may differ in thickness from each other. The dielectric mirror is in particular designed to reflect the light generated in the active region during operation of the semiconductor chip. For this purpose, the dielectric mirror is in particular designed to have a particularly high reflectivity in the wavelength range of the light which is generated in the active region. This can be done, for example, by a suitable choice of the number, thickness and refractive index of the first and second mirror layers.

According to at least one embodiment of the light-emitting semiconductor chip, the light-emitting semiconductor chip comprises a metallic mirror that is formed with an electrically conductive material. The metallic mirror contains or consists of at least one metal. The metallic mirror is characterized by a reflectivity of at least 50% for the light generated in the active region during operation of the semiconductor chip. The metallic mirror is further characterized by its electrical conductivity. Due to the electrical conductivity of the metallic mirror, it is possible to energize the active region via the metallic mirror. This means, in addition to its optical properties, the metallic mirror in the semiconductor chip also functions as a contact via which the active region of the semiconductor chip is energized during operation. The metallic mirror may contain at least one of the following metals or consist of at least one of the following metals: gold, silver, aluminum, rhodium.

According to at least one embodiment of the light-emitting semiconductor chip, the semiconductor body expands toward a light exit side. The light exit side can be, for example, the light exit side of the light-emitting semiconductor chip. The light exit side of the light-emitting semiconductor chip may, for example, be facing away from a mounting side of the light-emitting semiconductor chip. In particular, the light exit side may be formed on a side of the semiconductor chip facing away from a carrier for the semiconductor body. The light exit side is then that side of the semiconductor chip where most of the light leaving the semiconductor chip exits from it.

The semiconductor body expands in the present embodiment towards the light exit side. This means, in cross sections parallel to a main extension plane of the semiconductor body, the region of the semiconductor body increases toward the light exit side. For example, the cross-section of the semiconductor body is trapezoidal in shape perpendicular to the main extension plane within the production tolerance, with the longest side surface of the trapezoid facing the light exit side. For example, the semiconductor body has a cover surface on its side facing the light exit side, which is formed parallel to a bottom surface of the semiconductor body within the scope of the production tolerance. Side surfaces of the semiconductor body connect the bottom surface to the cover surface, with the side surfaces enclosing an angle greater than 90° to the bottom surface.

According to at least one embodiment of the light-emitting semiconductor chip, the dielectric mirror is arranged on a side of the semiconductor body which is facing away from the light exit side. This means, for example, the dielectric mirror is arranged on the bottom surface of the semiconductor body, from which the semiconductor body expands in direction of the light exit side. Between the dielectric mirror and the semiconductor body at least one further layer can be arranged, which may be a current extension layer, for example.

According to at least one embodiment of the light-emitting semiconductor chip, the metallic mirror contacts the semiconductor body through at least one opening in the dielectric mirror. This means, the dielectric mirror has at least one opening, preferably two or more openings. The opening penetrates the dielectric mirror completely, so that it is possible to contact the semiconductor body through the opening from the side of the dielectric mirror facing away from the semiconductor body. In the at least one opening of the dielectric mirror material of the metallic mirror is introduced, so that the metallic mirror electrically contacts the semiconductor body. The metallic mirror does not have to be in direct contact with the semiconductor body, but at least one further layer may be arranged between the metallic mirror and the semiconductor body.

According to at least one embodiment of the light-emitting semiconductor chip, apart from the at least one opening, the dielectric mirror covers the semiconductor body on its side facing away from the light exit side. Apart from the at least one opening, the dielectric mirror may in particular completely cover the semiconductor body on its side facing away from the light exit side. This means, for example, that the dielectric mirror on the side surfaces of the semiconductor body is flush with the semiconductor body or a layer arranged between the semiconductor body and the dielectric mirror, or the dielectric mirror projects beyond the semiconductor body in lateral directions. In this case, the mirror may, for example, be in direct contact with the semiconductor body or the layer.

The lateral directions are those directions which are parallel to the main extension plane of the semiconductor body. For its part, the metallic mirror can completely cover the dielectric mirror on its side facing away from the semiconductor body and be in direct contact there with the dielectric mirror, for example. In this way, the semiconductor body is completely covered by a layer sequence of dielectric mirror and metallic mirror, wherein the openings of the dielectric mirror are filled with material of the metallic mirror, so that also in the region of the openings, a reflection of the light generated in the active region takes place.

According to at least one embodiment, a light-emitting semiconductor chip is specified with—a semiconductor body comprising an active region, which is designed to generate light, —a dielectric mirror formed with an electrically insulating material, and —a metallic mirror, which is formed with an electrically conductive material, wherein —the semiconductor body expands toward a light exit side, —the dielectric mirror is arranged on a side of the semiconductor body facing away from the light exit side, —the metallic mirror is arranged on the side of the dielectric mirror facing away from the semiconductor body, —the metallic mirror electrically contacts the semiconductor body through at least one opening in the dielectric mirror, and— the dielectric mirror apart from the at least one opening completely covers the semiconductor body on its side facing away from the light exit side.

A light-emitting semiconductor chip described here may be based on the following considerations.

For light-emitting semiconductor chips, it is possible to form a metallic mirror to reflect the light generated during operation and to use silver as the metal, for example. Without explicit protection, this means adequate encapsulation of such a metallic mirror, the mirror is susceptible to corrosion, in particular in the production of the semiconductor chip, in which, for example, a separation into individual semiconductor chips takes place by etching. Such semiconductor chips can therefore only be produced if the etching depth is selected so that the metallic mirror is not attacked by the etching, this means if the etching depth is less than 1 μm deep.

To protect the metallic mirror, it is possible to pull the mirror behind the side surface of the semiconductor body, so that the semiconductor body projects beyond the mirror in lateral directions. However, this results in losses of energized surface and region in which the mirror is not present, so that overall a significantly reduced reflectivity results. This has a particularly negative effect on small light-emitting semiconductor chips with edge lengths of at most 300 μm.

It is also possible, for example, to encapsulate the mirror dielectrically, which, however, also leads to a loss of the energized surface, since the semiconductor body must continue to project beyond the mirror in lateral directions. Moreover, the reflectivity of the dielectric encapsulation is not comparable to that of, for example, a mirror made of silver, as it cannot be made neither of silver nor of aluminum for reasons of aging, in particular with regard to moisture migration, and corrosion, in particular with regard to salt mist.

In the light-emitting semiconductor chip described here, apart from the at least one opening, the dielectric mirror completely covers the side of the semiconductor body facing away from the light exit side. This means, due to the use of a dielectric mirror, it is not necessary to retract the mirror behind the side surfaces of the semiconductor body. Furthermore, the semiconductor body has a shape that expands in the direction of the light exit side of the semiconductor chip, whereby the semiconductor chip has a particularly large light emission region. Furthermore, the semiconductor body is energized by opening in the dielectric mirror, which makes it possible to uniformly energize the active region over its entire lateral extension.

Overall, the present light-emitting semiconductor chip may therefore be a small light-emitting semiconductor chip with a high luminous efficacy despite its relatively small edge length of at most 300 μm, for example.

According to at least one embodiment of the light-emitting semiconductor chip, a first current extension layer is arranged between the semiconductor body and the dielectric mirror. The first current extension layer completely covers the semiconductor body on its side facing away from the light exit side and is flush with it in lateral directions. This means, immediately adjacent to the first current extension layer, the semiconductor body does not project beyond the first current extension layer in lateral directions. This can be achieved, for example, by a common structuring of the current extension layer and of the semiconductor body in the production of the light-emitting semiconductor chip.

The first current extension layer is formed in particular transparent. In particular, due to its small thickness, the first current extension layer can have a high transparency of at least 85%, in particular of at least 90% for the light which passes through it and which is generated in the active region.

For example, the first current extension layer is a layer formed with a transparent conductive oxide such as ITO. The first current extension layer has a thickness of at most 100 nm, in particular of at most 50 nm, for example, 15 nm. The first current extension layer is designed to distribute an electric current impressed on its side facing the dielectric mirror as evenly as possible over the entire outer surface of the semiconductor body facing it. In particular, it is possible that the first current extension layer is directly adjoined to the first semiconductor body. For example, the first current extension layer directly adjoins to a p-conductive region of the first semiconductor body.

According to at least one embodiment of the light-emitting semiconductor chip, the dielectric mirror is in direct contact with the first current extension layer. This means, in this embodiment, that the dielectric mirror is directly applied to the first current extension layer and adheres via the first current extension layer to the semiconductor body of the light emitting semiconductor chip. In other words, in addition to its electrical and optical properties, the current extension layer also performs the function of an adhesion promoter between the semiconductor body and the dielectric mirror. It has been shown that an improved adhesion of the dielectric mirror to the semiconductor body can be achieved by using a current extension layer, which can be formed in particular with ITO, compared to a direct application of the dielectric mirror to the semiconductor body.

In the openings of the dielectric mirror, the metallic mirror is then in direct contact with the first current extension layer and embosses the current in the current extension layer for operation.

According to at least one embodiment of the light-emitting semiconductor chip, planarization completely surrounds the semiconductor body in lateral directions, the planarization along a vertical direction having a thickness that is greater than the thickness of the semiconductor body along the vertical direction. The vertical direction is that direction which is perpendicular to the lateral directions. For example, the vertical direction within production tolerance is parallel to a growth direction of the semiconductor body of the semiconductor chip.

The planarization is, for example, a layer that is inserted between trenches of the structured semiconductor body during the production of the optoelectronic semiconductor chip in order to obtain a flat surface for further processing. The planarization can be formed with an electrically insulating material such as silicon dioxide or silicon nitride or with an electrically conductive material such as nickel. The planarization completely surrounds the semiconductor body in lateral directions and forms the edge of the light-emitting semiconductor chip in places. The planarization is applied in a thickness which exceeds the thickness of the semiconductor body. However, it is possible for the semiconductor body to project beyond the planarization towards the light exit side in the vertical direction, but the thickness of the semiconductor body is less than the total thickness of the planarization.

Such a planarization protects the side surfaces of the semiconductor body particularly well against chemical and mechanical damage. For example, the semiconductor body is not exposed at any point on the side surfaces of the light-emitting semiconductor chip. In the production of the light-emitting semiconductor chip, a singulation into individual semiconductor chips takes place through the planarization. This means, in the event of final singulation into the light-emitting semiconductor chips, the semiconductor body is not separate, but the separating takes place laterally spaced apart from the semiconductor body, amongst other things, by the planarization. In this way, the chemical or mechanical stress of the semiconductor body is greatly reduced during separation, resulting in particularly durable semiconductor chips.

According to at least one embodiment of the light-emitting semiconductor chip, the semiconductor body is completely surrounded on the light exit side in the lateral directions by an electrically insulating material and is flush with the electrically insulating material or is projected in the vertical direction by the electrically insulating material, wherein the electrically insulating material is formed by a part of the dielectric mirror and/or by a part of a passivation. For example, the electrically insulating material is applied to the planarization on the light exit side of the semiconductor chip. The electrically insulating material can flush with the semiconductor body at the light exit side of the semiconductor chip and form a flat surface in this way. Furthermore, it is possible that the electrically insulating material projects beyond the semiconductor body in the vertical direction. Both lead to a particularly good mechanical and chemical protection of the semiconductor body during the production and operation of the semiconductor body.

According to at least one embodiment of the light-emitting semiconductor chip, a connection element for electrically contacting the active region is arranged such that the connection element surrounds the semiconductor body in lateral directions. For example, it is possible that the connection element surrounds the semiconductor body in the manner of a frame in lateral direction, so that the semiconductor body is completely laterally enclosed by the connection element. In this case, the connection element is arranged in particular laterally spaced from the semiconductor body. This means, the connection element is not in direct contact with the semiconductor body and does not cover the semiconductor body in a plan view of the semiconductor body, but is formed laterally spaced at least in places around the semiconductor body.

The connection element can, for example, be designed as a wire-contactable metallization. By way of the connection element, the light-emitting semiconductor chip can be contacted on the n-side, for example.

According to at least one embodiment of the light-emitting semiconductor chip, the connection element is arranged on the side of the electrically insulating material facing away from the carrier for the semiconductor body. The connection element may be in direct contact, for example, with a second current extension layer, so that the connection element is electrically conductively connected to the semiconductor body via the second current extension layer.

According to at least one embodiment of the light-emitting semiconductor chip, the light-emitting semiconductor chip comprises a further metallic mirror, which is arranged in places between the dielectric mirror and the metallic mirror. In this case, the metallic mirror may extend in places through the further metallic mirror to the semiconductor body. This means, the further metallic mirror may, for example, have an opening which extends from further metallic mirror through the dielectric mirror to the semiconductor body or the second current extension layer, whereby a contacting of the semiconductor body, for example, from its p-side, is achieved.

According to at least one embodiment of the light-emitting semiconductor chip, the further metallic mirror is potential-free during operation of the light-emitting semiconductor chip. This means, during operation of the light-emitting semiconductor chip, the further metallic mirror is neither at n-potential nor at p-potential.

Rather, the further metallic mirror is not connected, but is electrically isolated from the connections of the light-emitting semiconductor chip. This can be achieved, for example, by surrounding the further metallic mirror on all sides with electrically insulating layers of the semiconductor chip. This means, the further metallic mirror is in particular not exposed on a side surface of the semiconductor chip, but is completely embedded in electrically insulating layers of the semiconductor chip. This makes it possible to choose materials that tend to migrate in the electric field, for example, when moisture is present, for the further metallic mirror.

The further metallic mirror can therefore be formed in particular by silver or preferably aluminum or consist of one of these materials.

A method for producing a light-emitting semiconductor chip is further specified. In this method, a light emitting semiconductor chip described herein can be produced. This means, all of the features disclosed for the light-emitting semiconductor chip described herein are also disclosed for the method and vice versa.

According to at least one embodiment of the method, a substrate is provided first. The substrate is designed so that a semiconductor body can be epitaxially deposited on a growth surface of the substrate. In particular, the substrate may be a wafer formed with sapphire or silicon or made of one of these materials.

According to at least one embodiment, a semiconductor body comprising a first region having a connection layer, an active region on the side of the first region facing away from the substrate, and a second region on the side of the active region facing away from the first region is applied to the substrate. For example, the semiconductor body is epitaxially deposited on the substrate.

The first region of the semiconductor body is, for example, a n-conducting region of the semiconductor body. In the n-conducting region of the semiconductor body, a connection layer is embedded. This means, the connection layer is surrounded on both sides by further layers of the first region in the direction of the growth direction. The connection layer is characterized, for example, by a particularly good electrical conductivity, which can be achieved by a particularly high doping. For example, the dopant concentration in the connection layer is at least 10 times as high as the dopant concentration in the surrounding first region of the semiconductor body, in particular at least 100 times or 1000 times as large. The dopant concentration in the connection layer may be, for example, at least $10^{18}$ per cm$^3$, in particular at least $10^{19}$ per cm$^3$.

The second region of the semiconductor body, for example, may be a p-conducting region, which is doped with a p-doping substance. For example, the semiconductor body may be a semiconductor body based on a nitride compound semiconductor material. The n-doping substance may then be silicon, for example, the p-doping substance may be magnesium.

According to at least one embodiment of the method, the semiconductor body is removed in places from the side facing away from the substrate to below the connection layer. The removal in places of the semiconductor body takes place, for example, by reactive ion-etching. The removal of the semiconductor body in places is a mesa-etching, by which the semiconductor bodies of the semiconductor chips to be produced are defined. In the removal of the semiconductor body in places, trenches are produced in the semiconductor body along a lattice pattern, for example. In the region of the trenches, the second region, the active region and the first region are removed below the connection layer. A portion of the first region may remain and is not removed so that the semiconductor bodies are interconnected with individual semiconductor chips over the remaining portion of the first region and the substrate. Due to the removal of the semiconductor body in places from the side facing away from the substrate, a semiconductor body is produced for each semiconductor chip to be produced, which expands in the direction of the light exit side of the semiconductor chip.

According to at least one embodiment of the method, the substrate is removed in the next method step. The substrate can be removed mechanically and/or chemically and/or by means of laser radiation, for example. For example, if the substrate is a sapphire substrate, it may be peeled off by a laser lift-off method.

This means, the light-emitting semiconductor chips described here are free of a growth substrate.

The remaining individual semiconductor bodies of the semiconductor chips to be produced are connected to each other after removal, for example, via remaining parts of the first region.

According to at least one embodiment of the method, the method comprises a step in which the connection layer is exposed from the side facing the substrate before the substrate is removed by removing a part of the first region. This means, for example, the first region is removed by chemical-mechanical polishing until the connection layer is exposed. It is possible that when the connection layer is exposed, a separation into individual semiconductor body takes place, since the remaining parts of the first region are removed.

According to at least one embodiment of the method, the method comprises the subsequent steps: —providing a substrate, —applying a semiconductor body comprising a first region with a connection layer, an active region on the side of the first region facing away from the substrate and a second region on the side of the active region facing away from the first region, —removing the semiconductor body in places from the side facing away from the substrate to below the connection layer, —removal of the substrate, and —exposing the connection layer from the side facing the substrate prior to removal of the substrate by removing a part of the first region.

The method steps can be carried out in particular in the specified order.

According to at least one embodiment, the exposure of the connection layer is detected on the basis of a change in the surface occupancy by material of the semiconductor body. Upon exposure of the connection layer, a part of the first region is removed from the side facing the substrate before the substrate is removed. For example, the thickness of the first region is reduced evenly, which can be achieved, for example, by chemical mechanical polishing or etching. Upon reaching the connection layer, the first region between individual semiconductor bodies of light-emitting semiconductor chips to be produced is completely removed and a layer of electrically insulating material is exposed between the semiconductor bodies, for example. This means, before exposing the connection layer, the side facing the substrate before the substrate is removed, is formed completely or almost completely of material from the first region of the semiconductor body.

After exposing the connection layer, only semiconductor material of the semiconductor body is present in the region of the connection layer, whereas an electrically insulating material is present outside the connection layer, for example. Thus, by exposing the surface occupancy by material of the semiconductor body has changed from a state in which 100% of the outer surface facing the substrate before removal, is formed by semiconductor material to a state, in which less than 100%, for example, 90% or less, are formed by semiconductor material of the semiconductor body. This can be detected optically, for example, by optical recognition of the insulating material or by a change, in particular a reduction in the removal rate per unit of time, if the exposure is carried out by etching. In this way it is possible in a simple way to expose the connection layer accurately. Thus, for example, a layer of electrically insulating material is used as a marker layer, which is transferred to other layers. The electrically insulating material may then be, for example, the dielectric mirror or the passivation.

According to at least one embodiment of the method, a first current extension layer is applied to the second region on the side of the second region facing away from the active region before the semiconductor body is removed in places, wherein the first current extension layer is also removed in places when the semiconductor body is removed in places. This means, the first current extension layer is structured together with the semiconductor body, which ensures that the entire outer surface of the semiconductor body facing the first current extension layer is covered by the first current extension layer and in this way can be supplied with energizing over the entire surface in the light-emitting semiconductor chip to be produced.

According to at least one embodiment of the method, a dielectric mirror is applied to the side of the second region facing away from the active region before the semiconductor body is removed. In this case, it is also possible to remove the dielectric mirror in places when removing the semiconductor body in places. For example, the dielectric mirror is applied directly to the first current extension layer and subsequently structured together with the semiconductor body and the first current extension layer. In this case it is possible that the dielectric mirror is laterally flush with the first semiconductor body.

BRIEF DESCRIPTION OF THE DRAWINGS

In the subsequent, the light-emitting semiconductor chip described here as well as the method described here will be explained in more detail on the basis of exemplary embodiments and the associated figures.

FIG. 1R shows a first exemplary embodiment of a light-emitting semiconductor chip described here on the basis of a schematic sectional illustration.

FIG. 2P shows on the basis of a schematic sectional illustration, a second exemplary embodiment of a light-emitting semiconductor chip described here.

FIG. 3P shows, on the basis of a schematic sectional illustration, a third exemplary embodiment of a light-emitting semiconductor chip described here.

Figure 1A:
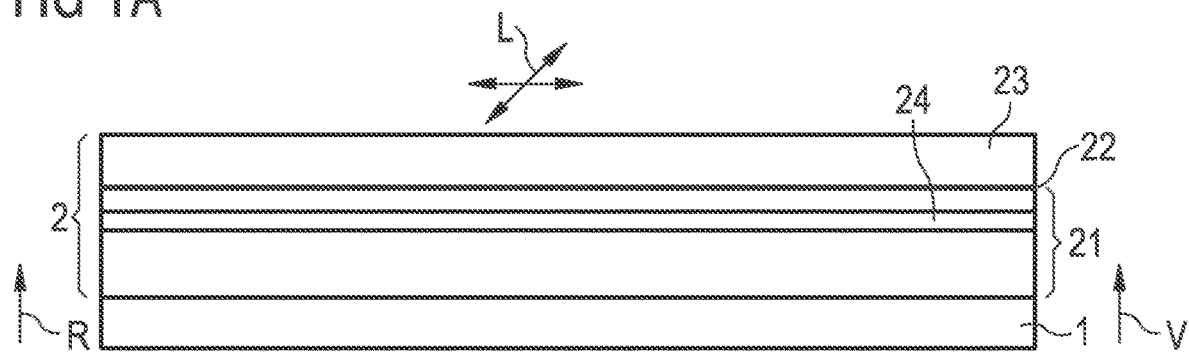
FIGS. 1A to 1R show a first embodiment of a method described here on the basis of schematic sectional illustration.

Same, similar or equivalent elements are provided in the figures with the same reference numerals. The figures and the proportions of the elements shown in the figures with each other are not to be considered to scale. Rather, individual elements may be exaggerated in size for better representability and/or better intelligibility.

DETAILED DESCRIPTION OF ILLUSTRATIVE EMBODIMENTS

Figure 1B:
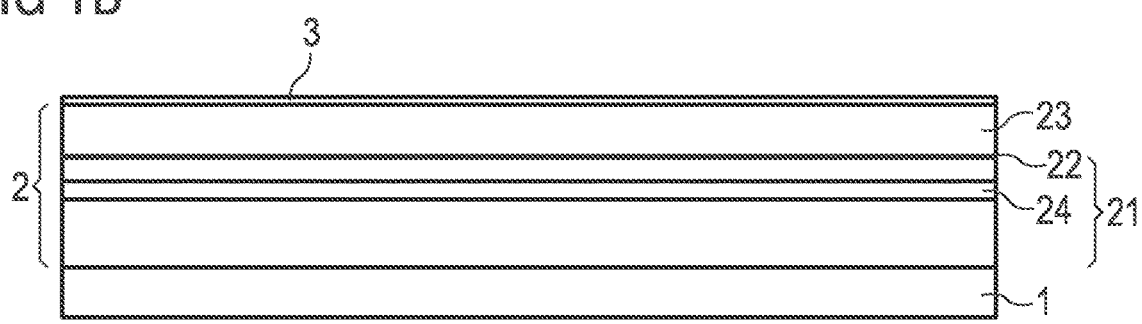
Figure 1C:
Figure 1D:
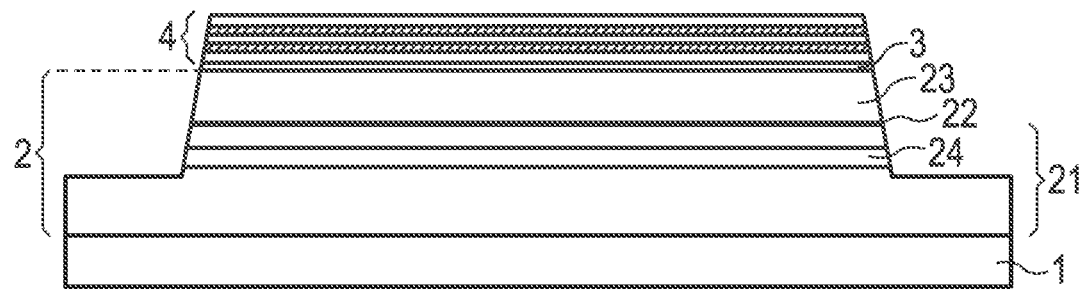
Figure 1E:
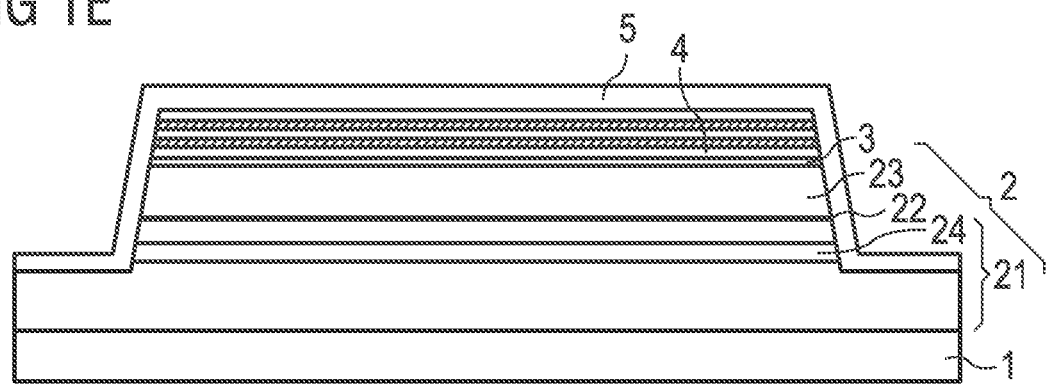
Figure 1F:
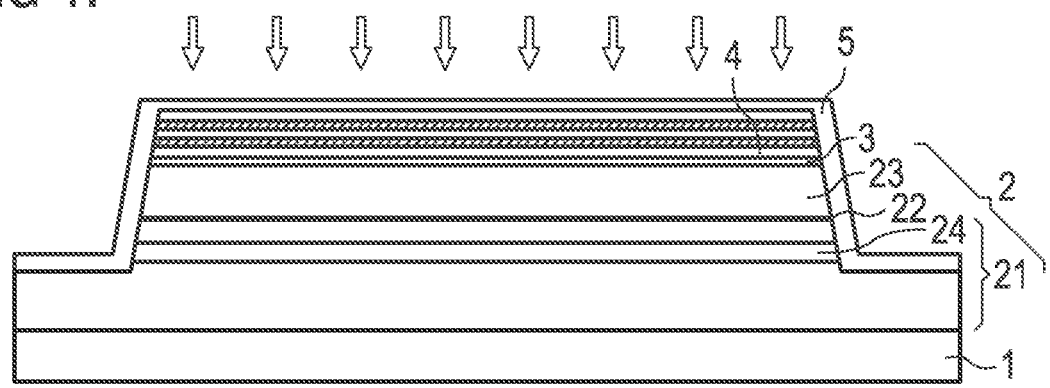
Figure 1G:
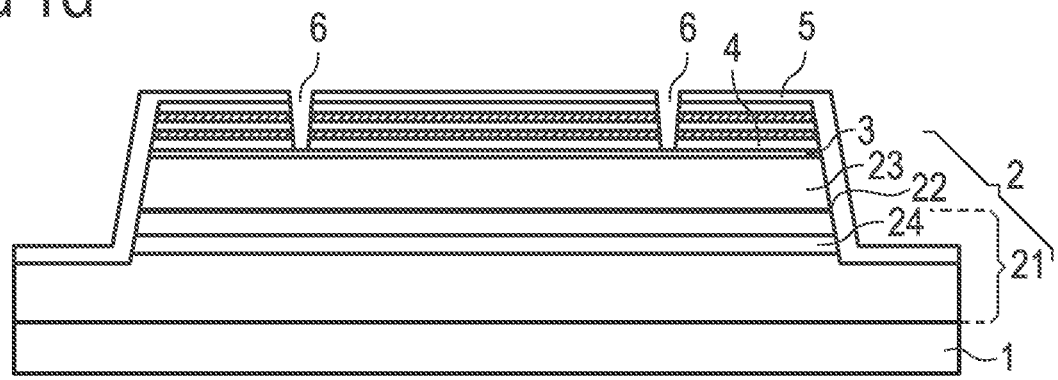
Figure 1H:
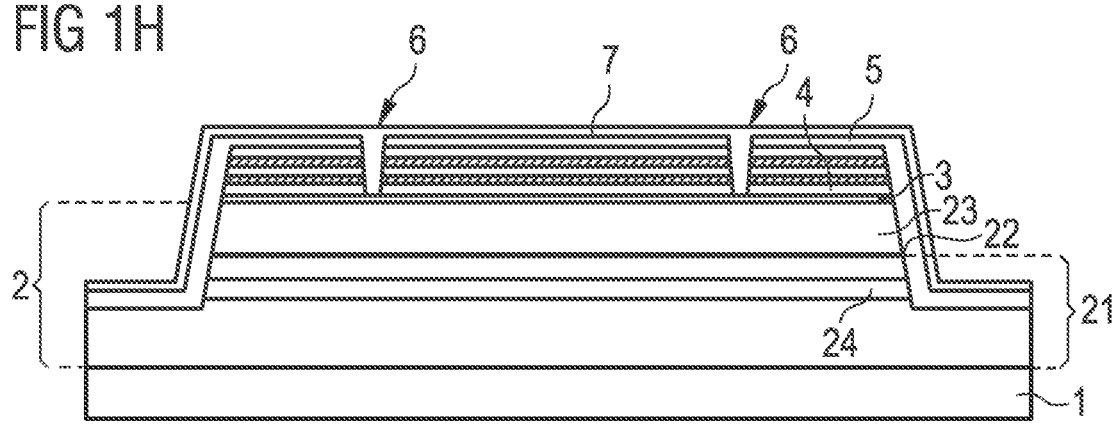
Figure 1I:
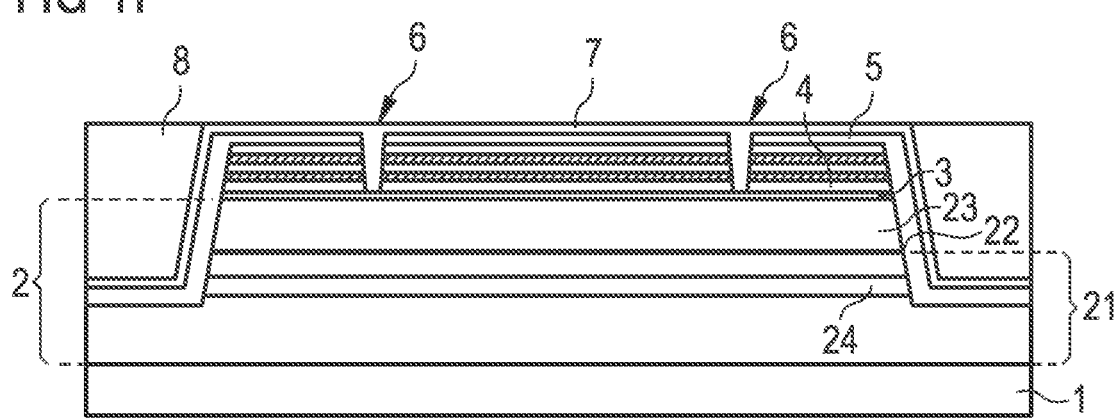
Figure 1J:
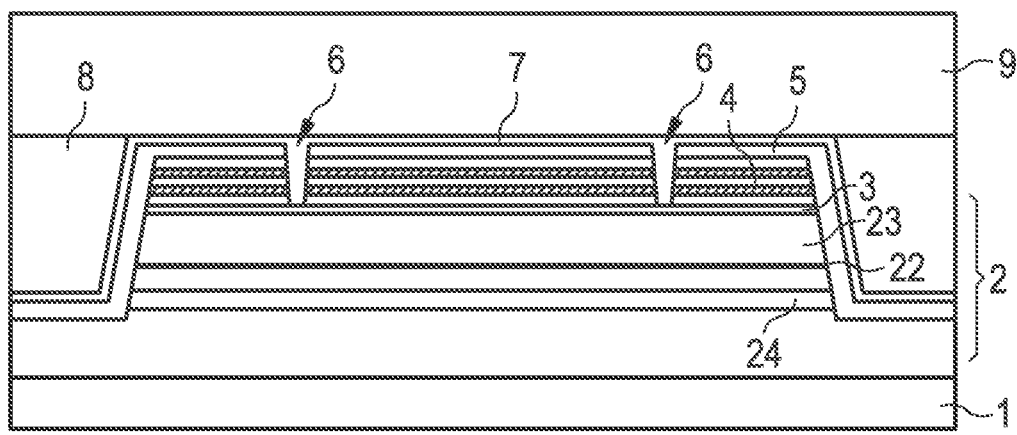
Figure 1K:
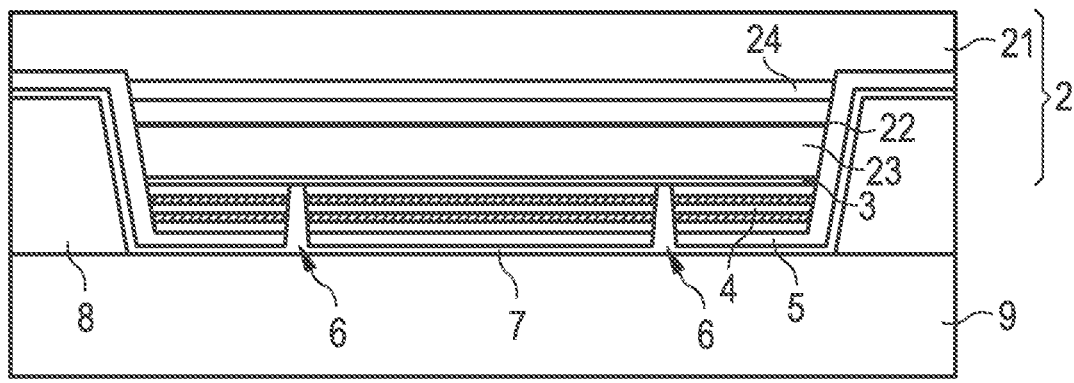
Figure 1L:
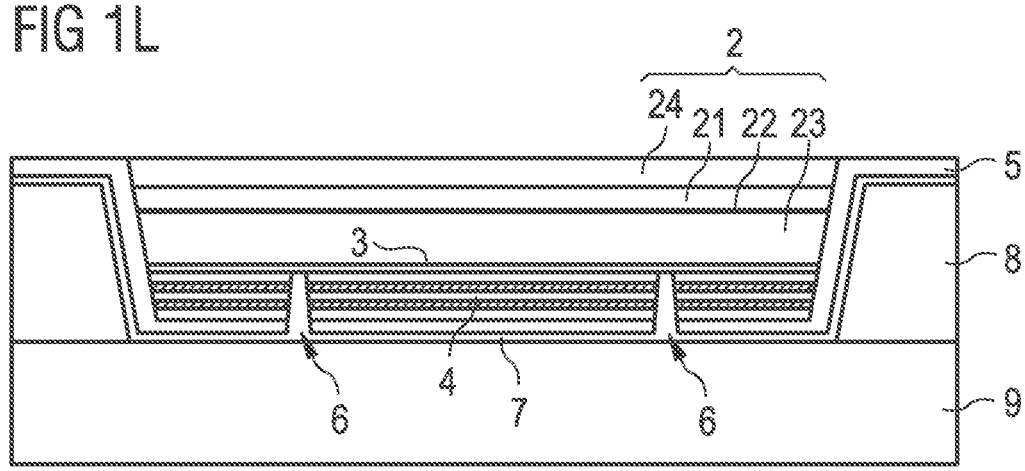
Figure 1M:
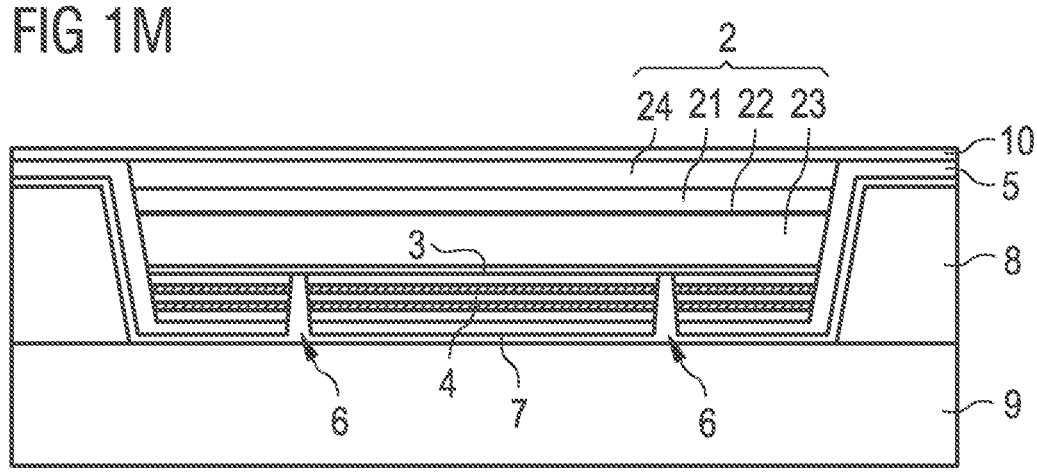
Figure 1N:
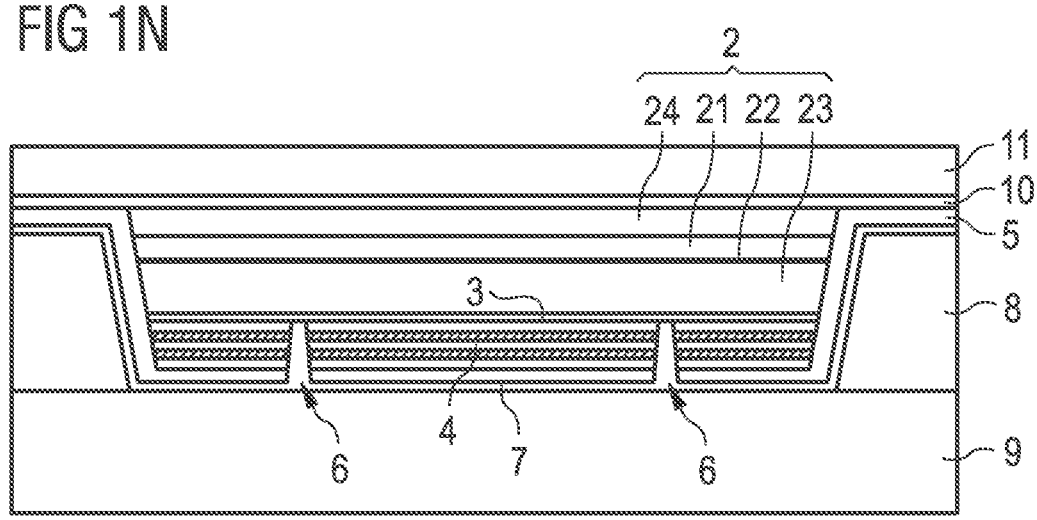
Figure 1O:
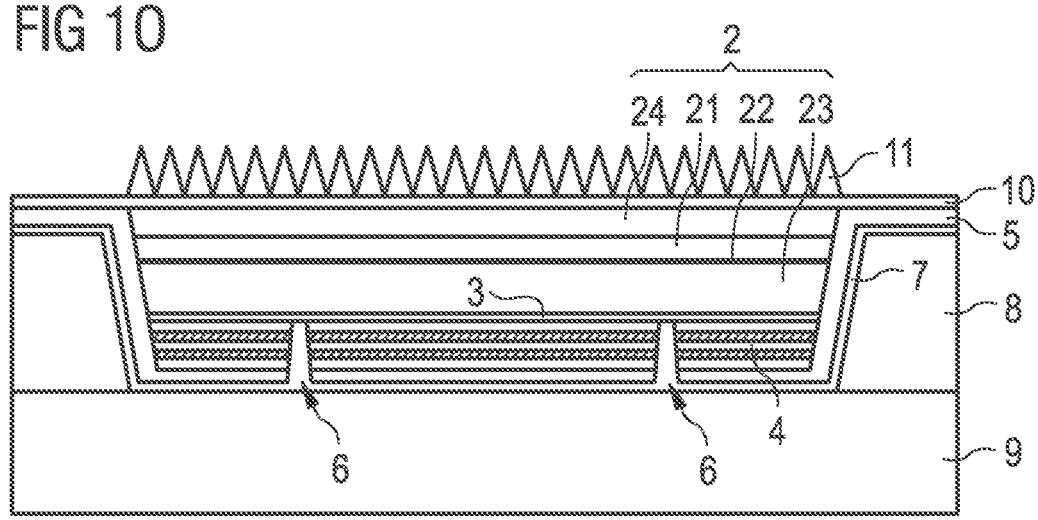
Figure 1P:
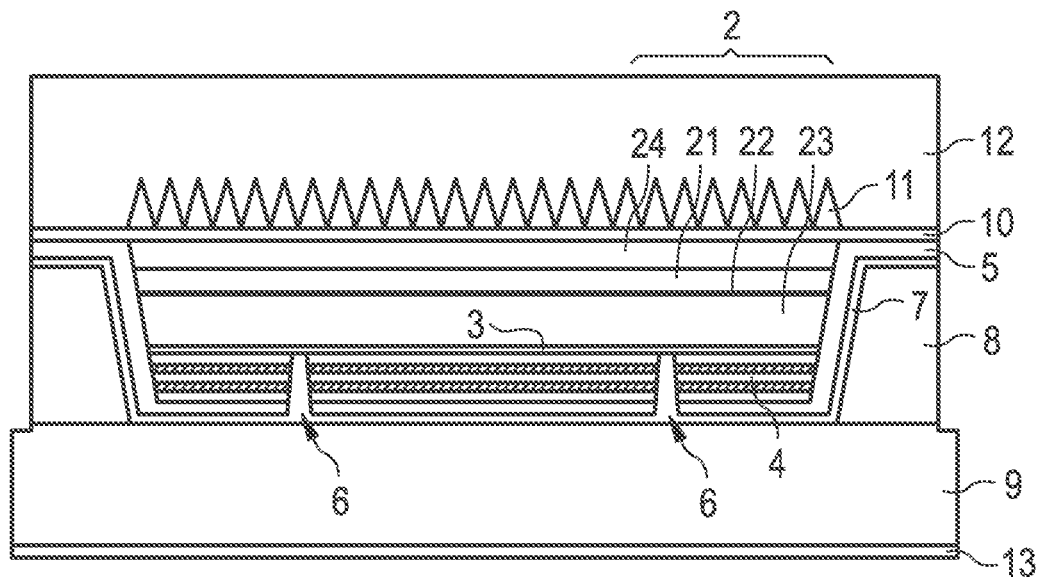
Figure 1Q:
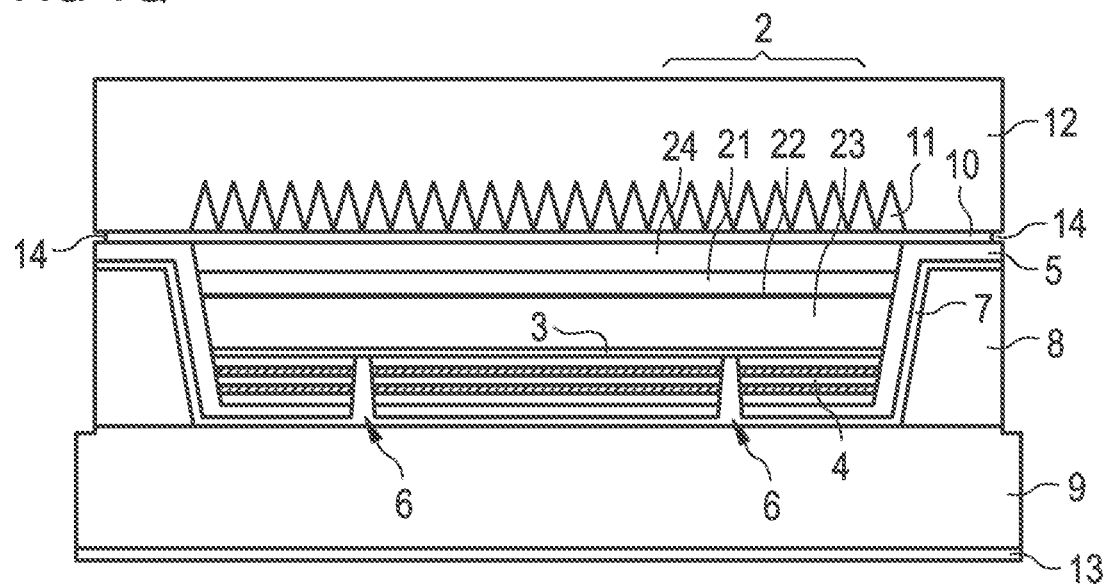
Figure 1R:
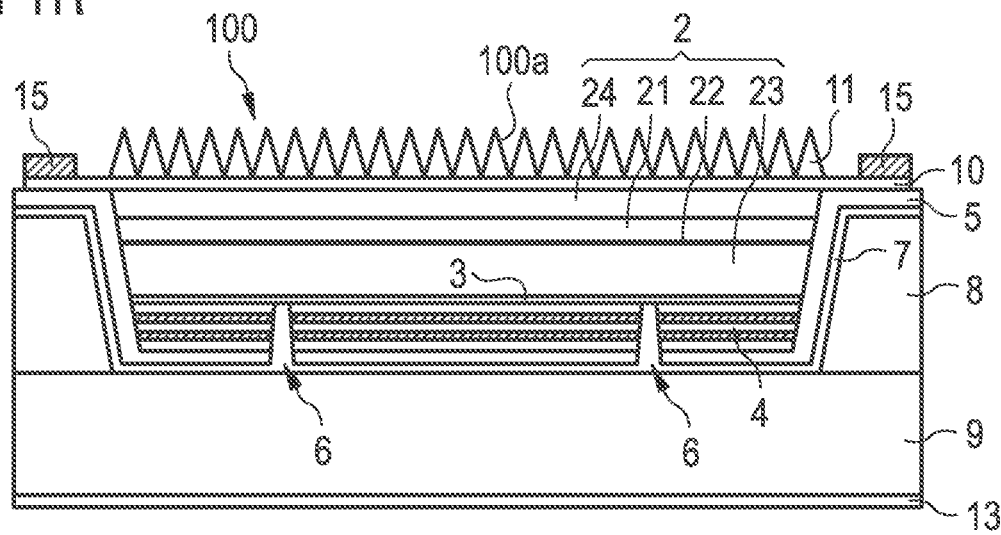

FIGS. 1A to 1R show a first embodiment of a method described here on the basis of schematic sectional illustrations.

At the beginning of the method, FIG. 1A, a substrate 1 is provided which is, for example, a growth substrate made of sapphire.

The semiconductor body 2 is applied on the substrate 1. The semiconductor body 2 comprises a first region 21 which is, for example, a n-conducting region, an active region 22, which is designed to generate light during operation of the semiconductor chip to be produced, and a second region 23 which, for example, can be a p-conducting region. For example, the first region 21 has a thickness of about 6 µm, and the second region 23 has a thickness of about 130 nm.

Furthermore, FIG. 1A shows the connection layer 24 that is embedded in the first region 21. This means, along the growth direction R, with which the semiconductor body 2 is epitaxially grown on the substrate and which runs parallel to the vertical direction V, further material of the first region 21 is disposed below and above the connection layer 24. The vertical direction V is perpendicular to the lateral directions L, which run parallel to the main extension plane of the semiconductor body 2 or of the substrate 1.

In the next method step, FIG. 1B, the first current extension layer 3 is applied to the upper side of the second region 23 facing away from the substrate 1. The current extension layer, for example, may be a thin ITO layer which may have a thickness of approximately 15 nm. An annealing can be performed after the ITO layer has been applied.

In the next method step, FIG. 1C, a dielectric mirror 4 is applied to the exposed outer surface of the first current extension layer 3. For example, the dielectric mirror 4 comprises first mirror layers 41 and second mirror layers 42. The first mirror layers 41 contain silicon dioxide, for example, the second mirror layers 42 may contain, for example, titanium dioxide or $Nb_2O_5$. For example, the first mirror layers 41 have a thickness of approximately 100 nm each and the second mirror layers 42 have a thickness of approximately 60 nm each. In connection with FIG. 1D, a method step is illustrated in which the semiconductor body 2 is removed in places from the side facing away from substrate 1 to below connection layer 24. In this case, the dielectric mirror 4 and the first current extension layer 3 are also removed. The removal takes place, for example, by a plasma-assisted etching, such as, for example, a reactive ion etching. The ablation creates trenches between unstructured regions of the semiconductor body 2, which, for example, have a width of less than 30 µm. The distance between unstructured regions of the semiconductor body 2 can be ≤150 µm, so that particularly small light-emitting semiconductor chips can be produced with this method.

For example, when ablating the semiconductor body 2 in places up to below the connection layer 24, an AlGaN layer with a high aluminum concentration and a low gallium concentration may be used as the marker layer, which indicates that the connection layer 24 has been removed. This marker layer can be arranged between the substrate and the connection layer a few 10 nm below the connection layer 24 and is detected, for example, by a decrease of the gallium signal.

In the next method step, FIG. 1E, a large-area passivation 5 in the form of a layer is applied to the semiconductor body 2, the first current extension layer 3 and the dielectric mirror 4. The passivation is, for example, a $SiO_2$ layer. The passivation 5 can be applied, for example, by means of a CVD method.

In the next method step, FIG. 1F, the passivation arranged in the area of the dielectric mirror is treated, for example, polished, on its upper side facing away from the dielectric mirror 4. The polishing can be done by means of chemical-mechanical polishing. In particular, the polishing reduces the roughness of the passivation 5 and reduces the thickness of the passivation 5 above the dielectric mirror 4.

In the subsequent method step, FIG. 1G, openings 6 are inserted into the dielectric mirror 4, which completely penetrate the dielectric mirror 4 and expose the first current extension layer 3 on its bottom surface. The openings also pass through the passivation 5. The openings 6 are produced, for example, by reactive ion etching.

In the next method step, FIG. 1H, the application of a metallic mirror 7 takes place. In the present case, the metallic mirror covers the entire semiconductor body 2 and fills in particular the openings 6 and is thus in direct contact with the first current extension layer 3. The metallic mirror is in the present case, a mirror which is formed with a metal that is not susceptible to corrosion and is not prone to moisture migration. For example, the metal is rhodium. With such a metal, it is possible to apply the metallic mirror 7 over a large area on the semiconductor body 2, without the need to remove the metallic mirror between the unstructured regions of the semiconductor body, where the edge of the light-emitting semiconductor chip to be produced is located later.

Alternatively, however, it is possible to selectively apply the metallic mirror 7 only above the dielectric mirror 4 on its side facing away from the semiconductor body 2 or to remove the metallic mirror in the edge regions, so in the trenches between the unstructured regions of the semiconductor layer sequence. In this case, a metal that is susceptible to corrosion and/or tends to moisture migration can also be used for the metallic mirror. For example, the metallic mirror in this case may be formed with silver. By using silver in the metallic mirror 7, the efficiency of the light-emitting semiconductor chip to be produced is further increased, but this is accompanied by an increased effort in the production of the light-emitting semiconductor chip.

In the next method step, FIG. 1I, a planarization 8 is applied, which can be produced, for example, with a metal such as nickel or an electrically insulating material such as $SiO_2$. In the event that a metal is used as planarization, this can be applied, for example, by means of galvanic or electroless deposition. Furthermore, a polishing step is performed, for example, by means of chemical-mechanical polishing, in which a flat surface is generated on the upper side facing away from the substrate, in which the planarization 8 is flush with the metallic mirror 7 on the upper side of the passivation 5 facing away from the dielectric mirror 4.

In the next method step, FIG. 1J, a carrier 9 is attached to the side facing away from the substrate 1. For example, the carrier 9 may be an auxiliary carrier, which is replaced again after completion of the method. Furthermore, it is possible that the carrier 9 is a permanent carrier which remains in the light-emitting semiconductor chip to be produced. The carrier 9 is then, for example, an electrically conductive carrier that may be formed with materials such as germanium or silicon. Furthermore, the carrier 9 may be formed with a metal or consist of a metal. The carrier 9 can be fixed by soldering, gluing or galvanic production.

In the next method step, FIG. 1K, the substrate 1 is removed, for example, by a laser lift-off method.

In the subsequent method step, FIG. 1L, the connection layer 24 is exposed from the side facing the substrate 1 before the substrate 1 is detached by removing of a part of the first region 21. The exposure can be achieved, for example, by chemical-mechanical polishing or by etching. The fact that the connection layer 24 is exposed can be detected on the basis by a change in the surface occupancy by material of the semiconductor body 2. Thus, before exposing the connection layer 24, the entire upper side facing away from the carrier 9 is formed by material of the semiconductor body 2, in particular the first region 21. When removing the first region 21, for example, when thinning by polishing or etching, the passivation 5 is exposed, which projects beyond the connection layer 24 in the vertical direction V or is flush with it. This means, the surface occupancy of semiconductor material changes from a surface completely formed by semiconductor material to a surface partially formed with passivation material 5. This can be determined, for example, optically or by changing the etching rate.

It results an arrangement in which the connection layer 24 is flush with the passivation 5 on the upper side facing away from the carrier 9.

In the next method step, FIG. 1M, a second current extension layer 10 is applied over the entire surface on the side facing away from the carrier 9. The second current extension layer 10 completely covers the connection layer 24. The second current extension layer 10 is formed, for example, with ITO and has a thickness of 30 nm.

The second current extension layer 10 is in direct contact with the connection layer 24.

In the next method step, FIG. 1N, a decoupling layer 11, which may be formed, for example, with titanium dioxide or $Nb_2O_5$, is applied to the upper side of the second current extension layer 10 facing away from the carrier 9. The coupling-out layer 11, for example, may have a thickness of 2 μm and can be structured into light coupling-out structures by reactive ion etching in the subsequent method step, FIG. 1O. The light coupling-out structures of the coupling-out layer 11, for example, form elevations on the second current extension layer 10, which make a light emission from the semiconductor body more probable during operation of the semiconductor chip.

In the next method step, FIG. 1P, the carrier 9 is optionally thinned and sawing trenches are produced from the side facing away from the carrier 9, which extend to the carrier 9. In this case, the coupling-out layer 11 can be covered by means of a protective layer 12, which may be formed, for example, by a water-soluble lacquer. Furthermore, a contact layer 13 is applied to the side of the carrier 9 facing away from the protective layer 12, via which the light-emitting semiconductor chip can be contacted on the p-side during operation, for example.

In the subsequent method step, FIG. 1Q, the second current extension layer 10 can be retracted at the edges of the light-emitting semiconductor chip to be produced by forming a groove 14. In this way, short circuits at the chip edge can be prevented during operation of the semiconductor chip.

In the final method step, FIG. 1R, a division into individual semiconductor chips takes place, for example, by "plasma dicing" by means of reactive ion etching, removal of the protective layer 12 and separation of the contact layer 13.

The result is the light-emitting semiconductor chip shown in FIG. 1R according to a first exemplary embodiment of a light-emitting semiconductor chip described here.

The light-emitting semiconductor chip comprises the semiconductor body 2, which has an active region 22 for generating light. Furthermore, the light-emitting semiconductor chip comprises the dielectric mirror 4, which is arranged on the side of the semiconductor body 2 facing away from the light exit side 100a. For example, the dielectric mirror has a multiplicity of first mirror layers 41 and second mirror layers 42, which differ from one another to their refractive index and their thickness.

The light-emitting semiconductor chip has a metallic mirror 7, which is formed with an electrically conductive material, for example, rhodium. The metallic mirror 7 is arranged on the side of the dielectric mirror 4 facing away from the semiconductor body 2. The metallic mirror 7 contacts the semiconductor body 2 via the first current extension layer 3 through openings 6 in the dielectric mirror 4. Apart from the openings 6, the dielectric mirror 4 completely covers the semiconductor body 2 on its side facing away from the light exit side 100a. All side surfaces of the semiconductor body 4 are free of the dielectric mirror 4.

On the side facing away from the carrier 9, the second current extension layer 10 extends completely over the semiconductor body 2 and is in direct contact with the connection layer 24. In this way, the light-emitting semiconductor chip can be contacted over its entire surface on the p-side, via the first current extension layer 3, and on the n-side, via the second current extension layer 10, without connection points covering the semiconductor body 2 on its side facing away from the carrier 9. An electrical connection on the upper side of the semiconductor chip facing away from the carrier 9 can take place, for example, in the edge region at the second current extension layer 10 above the planarization 8. For this purpose, a connection element 15 may be formed, for example, as a frame around the semiconductor body 2. The connection element 15, for example, may be formed wire-contactable.

The described light-emitting semiconductor chip is characterized, for example, that the p-side mirror is a dielectric mirror 4, which can be mesa-structured together with the semiconductor body 2 before the metallic mirror 7 is applied. The mesa-structuring, so the removal of the semiconductor body 2 in places, takes place at a defined etching depth beyond the connection layer 24 using an aluminium-containing marker layer, for example, which is linked to the connection layer 24 with regard to their position in the vertical direction in semiconductor body 2.

The connection layer 24 is exposed by detecting the change in the surface occupancy by semiconductor material. The semiconductor body is contacted on the n-side, over the entire surface by means of a thin second current extension layer, which is arranged on a largely flat outer surface of the semiconductor body 2.

Because the dielectric mirror 4 is used in the present case, no encapsulation of the mirror against the corrosive gas Cl is necessary, which can be used for removing the semiconductor body in places. In this way, a true self-adjusting structuring of the dielectric mirror 4 together with the semiconductor body is possible.

Furthermore, in the light-emitting semiconductor chip described here, the active region 22 is energized over the entire surface from the p-side as well as from the n-side through the respective current extension layers 3, 10.

In particular for the case that the metallic mirror 7 is formed with a non-corrosive metal such as rhodium, the light-emitting semiconductor chip does not contain age-susceptible components, so that an explicit encapsulation, for example, against moisture is no longer necessary.

Furthermore, the light-emitting semiconductor chip described here can be produced by means of a small number of photo techniques, which leads to a particularly cost-effective light-emitting semiconductor chip.

The fact that the semiconductor body 2 expands in the direction of the light exit side, thus the semiconductor chip has an inverse mesa, allows a better light coupling-out, which is particularly positive with small light-emitting semiconductor chips with edge lengths of ≤300 µm. In addition, the side surfaces of the semiconductor body in the light-emitting semiconductor chip are mirrored by the passivation 5 and the metallic mirror layer 7, so that a lateral emission is suppressed, which further increases the luminance at the light exit side 100a of the semiconductor chip.

Figure 2A:
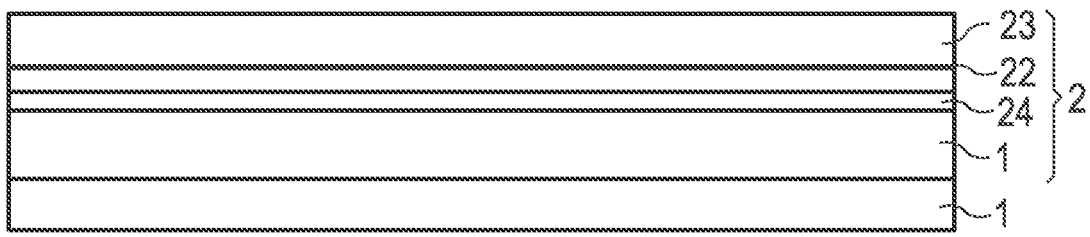
FIGS. 2A to 2P show a second exemplary embodiment of a method on the basis of schematic sectional illustration.

In connection with the FIGS. 2A to 2P, a further exemplary embodiment of a light-emitting semiconductor chip described here is explained in more detail.

In contrast to the exemplary embodiment of FIGS. 1A to 1R, in the second exemplary embodiment of the production method the structuring of the semiconductor body takes place by removing the semiconductor body in places from the side facing away from the substrate to below the connection layer 24 before applying the dielectric mirror 4.

At the beginning of the method, FIG. 2A, a substrate 1 is provided, which is, for example, a growth substrate consisting of sapphire. On the substrate 1, the semiconductor body 2 is applied. The semiconductor body 2 comprises a first region 21 which is, for example, an n-conducting region, an active region 22 which is formed to generate light in the operation of the semiconductor chip to be produced, and a second region 23 which, for example, can be a p-conducting region. For example, the first region 21 has a thickness of approximately 6 µm and the second region 23 has a thickness of approximately 130 nm. Furthermore, FIG. 2A shows the connection layer 24 embedded in the first region 21. This means, along the growth direction R with which the semiconductor body 2 is epitaxially grown on the substrate and which runs parallel to the vertical direction V, further material of the first region 21 is arranged below and above the connection layer 24. The vertical direction V runs perpendicular to the lateral directions L which run parallel to the main extension plane of the semiconductor body 2 or of the substrate 1.

Figure 2B:
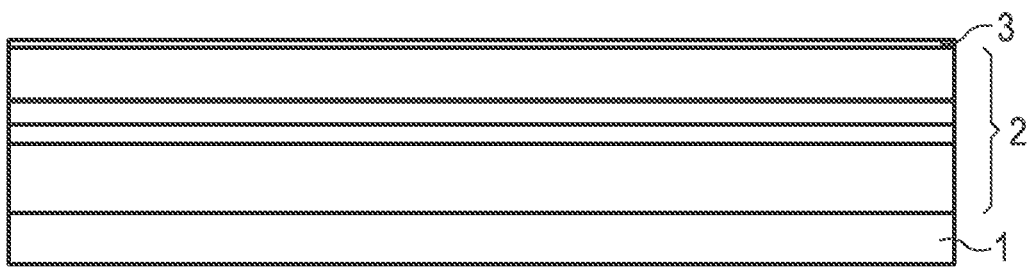

In the next method step, FIG. 2B, the first current extension layer 3 is applied to the upper side of the second region 23 facing away from the substrate 1. For example, the first current extension layer 3 may be a thin ITO layer, which may have a thickness of approximately 15 nm. An annealing can be performed after the ITO layer has been applied.

Subsequently, FIG. 2C, the semiconductor body 2 is removed in places from the side facing away from the substrate 1 to below the connection layer 24. In this case, the first current extension layer 3 is also removed. The removal takes place, for example, by a plasma-assisted etching, such as, for example, a reactive ion etching. The removal creates trenches between unstructured regions of the semiconductor body 2, which, for example, have a width of less than 30 µm. The distance between unstructured regions of the semiconductor body 2 can be ≤150 µm, so that particularly small light-emitting semiconductor chips can be produced by the method.

For example, when removing the semiconductor body 2 in places to below the connection layer 24, an AlGaN layer with a high aluminum concentration and a low gallium concentration may be used as marker layer which indicates that the connection layer 24 has been removed. This marker layer can be arranged between the substrate and the connection layer a few 10 nm below the connection layer 24 and is detected, for example, by a decrease in the gallium signal.

Figure 2C:
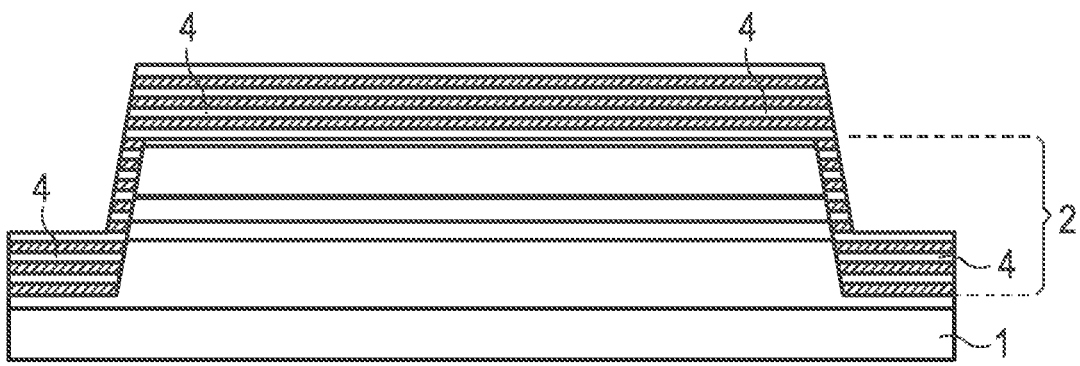

As shown in FIG. 2C, the dielectric mirror 4 is subsequently applied over the entire surface of the already structured semiconductor body 2, so that the dielectric mirror 4 covers the side of the semiconductor body 2 facing away from the substrate 1 in a conformal manner as a layer.

Figure 2D:
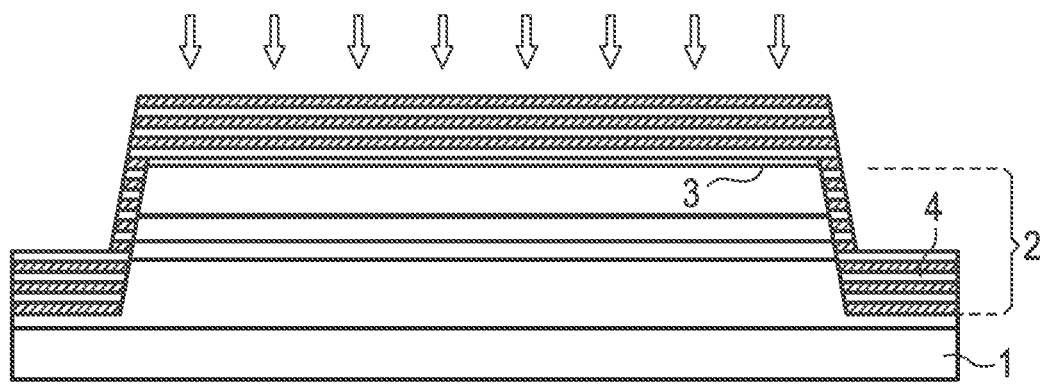

In the next method step, FIG. 2D, the dielectric mirror is treated on its upper side, for example, polished. The polishing can be done by means of chemical-mechanical polishing. The polishing particularly reduces the roughness and reduces the thickness of the dielectric mirror 4.

Figure 2E:
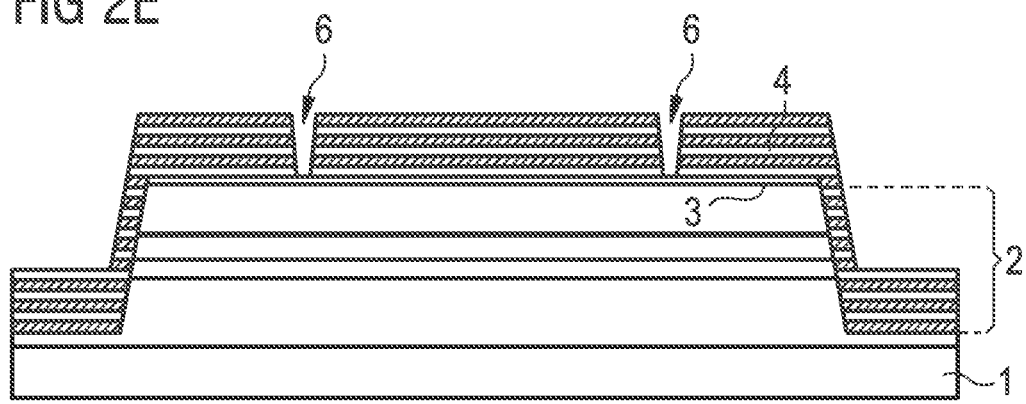

In the subsequent method step, FIG. 2E, openings 6 are inserted into the dielectric mirror 4, which completely penetrate the dielectric mirror 4 and expose the first current extension layer 3 on its bottom surface. The openings 6, for example, are generated by reactive ion etching.

Figure 2F:
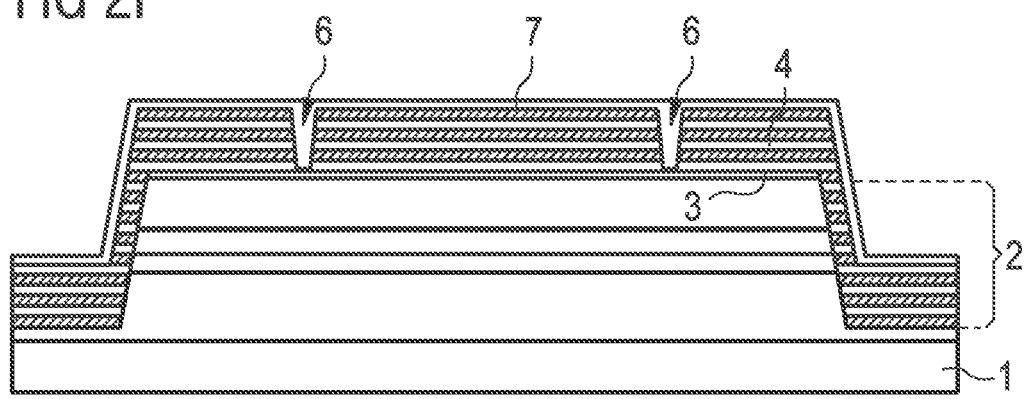

In the next method step, FIG. 2F, the application of a metallic mirror 7 takes place. In the present case, the metallic mirror covers the entire semiconductor body 2 and in particular fills the openings 6 and is thus in direct contact with the first current extension layer 3. In this case, the metallic mirror 7 is a mirror which is formed with a metal which is less susceptible to corrosion and does not tend to moisture migration. For example, the metal is rhodium. With such a metal, it is possible to apply the metallic mirror 7 over a large area on the semiconductor body 2, without the need to remove the metallic mirror 7 between the unstructured areas of the semiconductor body 2, where the edge of the light-emitting semiconductor chip to be produced will later be located.

Alternatively, however, it is possible to selectively apply the metallic mirror 7 only above the dielectric mirror 4 on its side facing away from the semiconductor body 2 or to remove the metallic mirror in the edge regions, in the trenches between the unstructured regions of the semiconductor layer sequence. In this case, a metal that is susceptible to corrosion and/or tends to moisture migration can also be used for the metallic mirror. For example, the metallic mirror 7 may in this case be formed with silver. By using silver in the metallic mirror 7, the efficiency of the light-emitting semiconductor chip to be produced is further increased, but this is accompanied by an increased effort in the production of the light-emitting semiconductor chip.

Figure 2G:
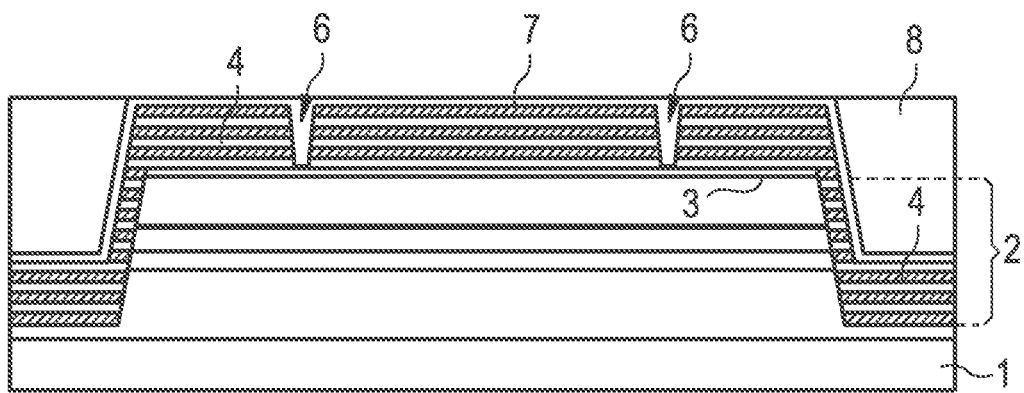

In the next method step, FIG. 2G, a planarization 8 is applied, which can be produced, for example, with a metal such as nickel or an electrically insulating material such as $SiO_2$. In the event that nickel is used as planarization, this can be applied, for example, by means of galvanic or electroless deposition. Furthermore, a polishing step is performed, for example, by means of chemical-mechanical polishing, in which a flat surface is created on the upper side facing away from the substrate, in which the planarization 8 is flush with the metallic mirror 7.

Figure 2H:
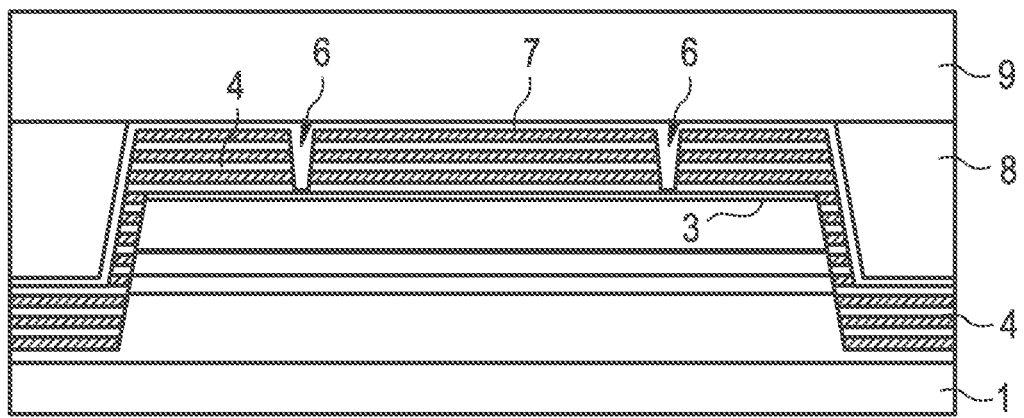

In the next method step, FIG. 2H, a carrier 9 is attached to the side facing away from the substrate 1. The carrier 9, for example, may be an auxiliary carrier, which is replaced again after completion of the method. Furthermore, it is possible that the carrier 9 is a permanent carrier which remains in the light-emitting semiconductor chip to be produced. The carrier 9 is then, for example, an electrically conductive carrier that may be formed with materials such as germanium or silicon. Further, the carrier 9 may be formed with a metal or consist of a metal. The carrier 9 can be fixed by soldering, gluing or galvanic production.

In the next method step, FIG. 2I, the substrate 1 is removed, for example, by a laser lift-off method.

In the subsequent method step, FIG. 2J, the connection layer 24 is exposed from the side facing the substrate 1 before the removal of the substrate 1 by removing a part of the first region 21. The exposure can take place, for example, by chemical-mechanical polishing or by etching. The fact that the connection layer 24 is exposed can be detected on the basis of a change in the surface occupancy by material of the semiconductor body 2. Thus, before exposing the connection layer 24, the entire upper side facing away from the carrier 9 is formed by material of the semiconductor body 2, in particular the first region 21. When removing the first region 21, for example, when thinning by polishing or etching, the dielectric mirror 4 is exposed, which in the vertical direction V projects above or flush with the connection layer 24. This means, the surface occupancy by semiconductor material changes from a surface completely formed by semiconductor material to a surface partially formed by material of the dielectric mirror 4. This can be determined, for example, optically or by changing the removal rate per unit time.

In the method step of FIG. 2J, the dielectric mirror 4 thus serves as a marker layer for reaching the connection layer 24. The removal of the semiconductor body in places, that is to say the mesa etching, takes place here deeper than in the first exemplary embodiment of the method described here, so that the dielectric mirror 4 is arranged substantially below the connection layer 24, so that it is largely removed by the subsequent exposure of the connection layer 24. In this way, undesired side emissions during operation of the light-emitting semiconductor chip can be efficiently suppressed.

The result is an arrangement in which the connection layer 24 is flush with the dielectric mirror 4 on the upper side facing away from the carrier 9.

In the next method step, FIG. 2K, a second current extension layer is applied over the entire surface on the side facing away from the carrier 9. The second current extension layer 10 completely covers the connection layer 24. The second current extension layer 10, for example, is formed with ITO and has a thickness of 30 nm.

The second current extension layer 10 is in direct contact with the connection layer 24.

Figure 2L:
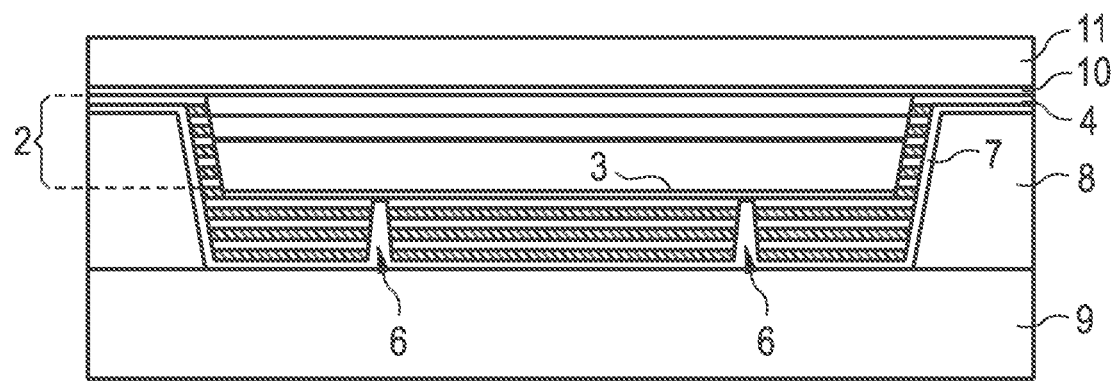
Figure 2M:
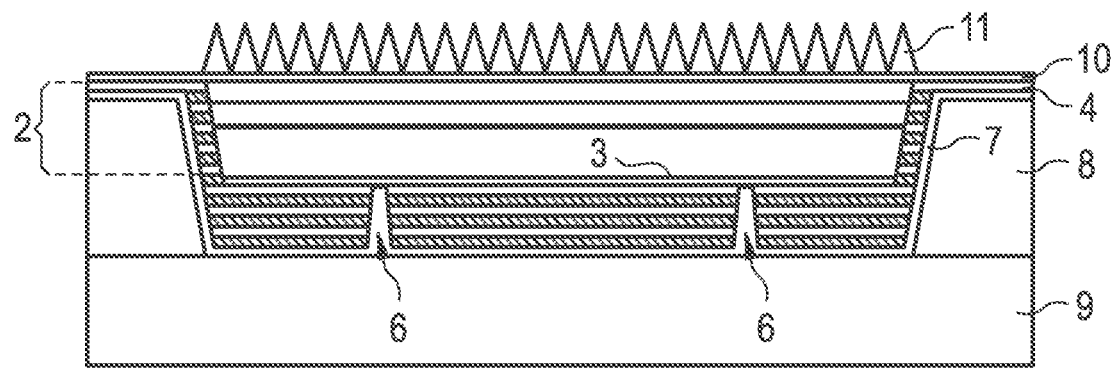

In the next method step, FIG. 2L, a decoupling layer 11, which may be, for example, formed with titanium dioxide or $Nb_2O_5$, is applied to the upper side of the second current extension layer 10 facing away from the carrier 9. The coupling-out layer 11, for example, may have a thickness of 2 µm and can be structured in the subsequent method step, FIG. 2M, to form light coupling-out structures by reactive ion etching. The light coupling-out structures of the coupling-out layer 11, for example, form elevations on the second current extension layer 10, which make a light emission from the semiconductor body 2 more probable in the operation of the semiconductor chip.

Figure 2N:
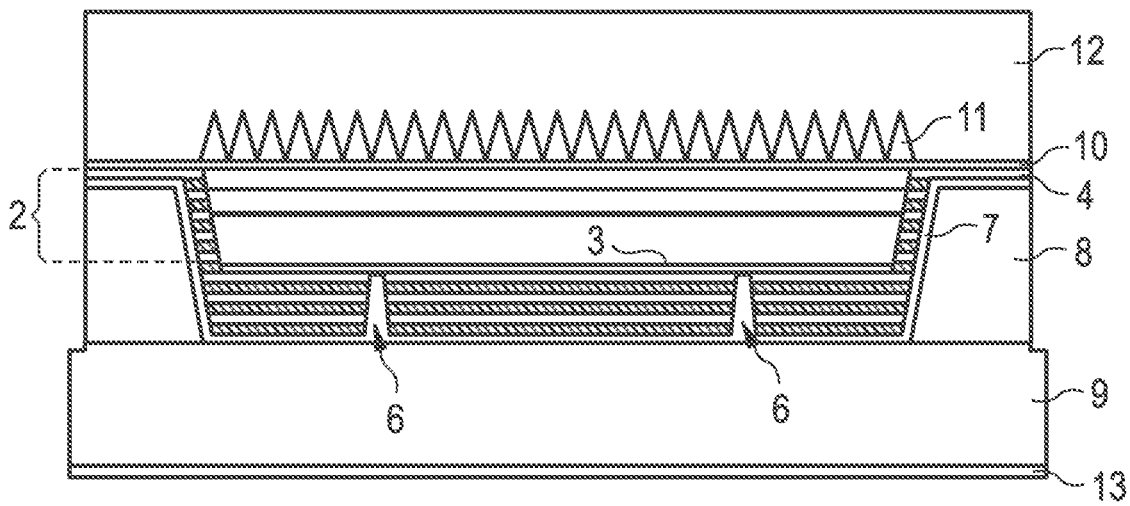

In the next method step, FIG. 2N, the carrier 9 is optionally thinned, and sawing trenches are produced from the side facing away from the carrier 9, which extend to the carrier 9. In this case, the coupling-out layer 11 can be protected by means of a protective layer 12, which may be formed, for example, by a water-soluble lacquer. Furthermore, a contact layer 13 is applied to the side of the carrier 9 facing away from the protective layer 12, via which the light-emitting semiconductor chip can be contacted on the p-side during operation, for example.

Figure 2O:
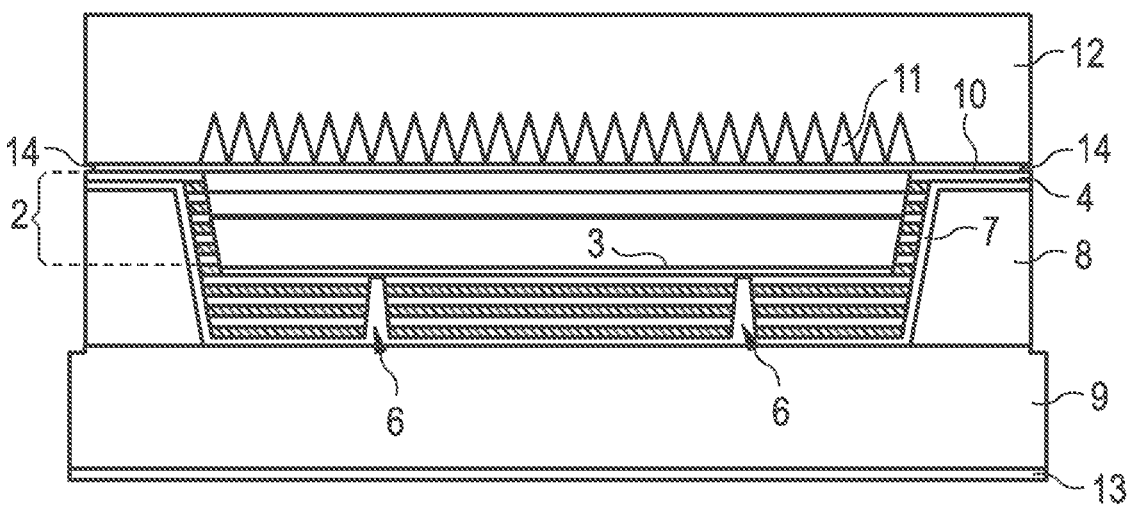

In the subsequent method step, FIG. 2O, the second current extension layer 10 can be retracted at the edges of the light-emitting semiconductor chip to be produced by forming a groove 14. In this way, short circuits on the chip edge can be prevented during operation of the semiconductor chip.

The FIG. 2P shows the resulting optoelectronic semiconductor chip according to the second exemplary embodiment. In contrast to the first exemplary embodiment, the semiconductor body 2 is flush with the dielectric mirror 4 on its side facing the light exit side 100a or is projected by the dielectric mirror 4 in vertical direction.

Figure 3A:
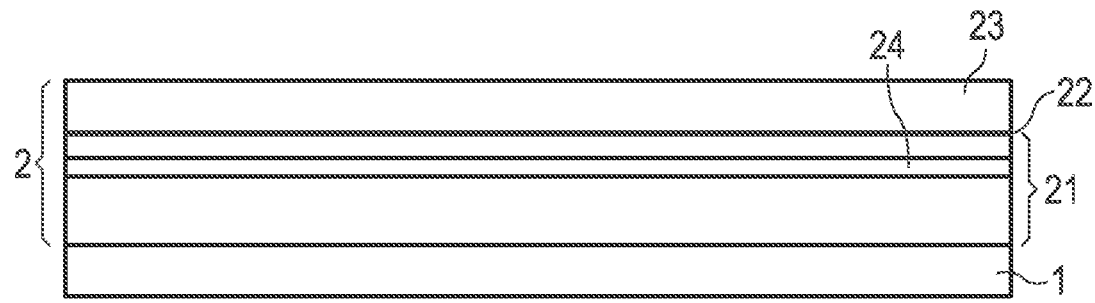
FIGS. 3A to 3P show a third embodiment of a method described here on the basis of schematic sectional illustrations.

In connection with FIG. 3A to 3P a further exemplary embodiment of a production method described here is explained. The production method initially proceeds as described in connection with FIGS. 1A to 1R.

First, as shown in FIG. 3A, a substrate 1 is provided, which is, for example, a growth substrate formed with sapphire or made of sapphire.

For example, the semiconductor body 2 is epitaxially deposited on the substrate 1. The semiconductor body 2 comprises a first region 21 which is, for example, an n-conducting region, an active region 22 which is set up to generate light during operation of the finished semiconductor chip, and a second region 23 which may be a p-conducting region, for example.

In the first region 21 of the semiconductor body 2, the connection layer 24 is arranged, which is surrounded on both sides in growth direction R by further material of the first region 21. The connection layer 24 extends, for example, parallel to a main extension plane of the semiconductor body 2 over its entire cross section. The connection layer 24 is characterized by a particularly high n-doping with a dopant concentration of at least $10^{18}$ pro $cm^3$.

Figure 3B:
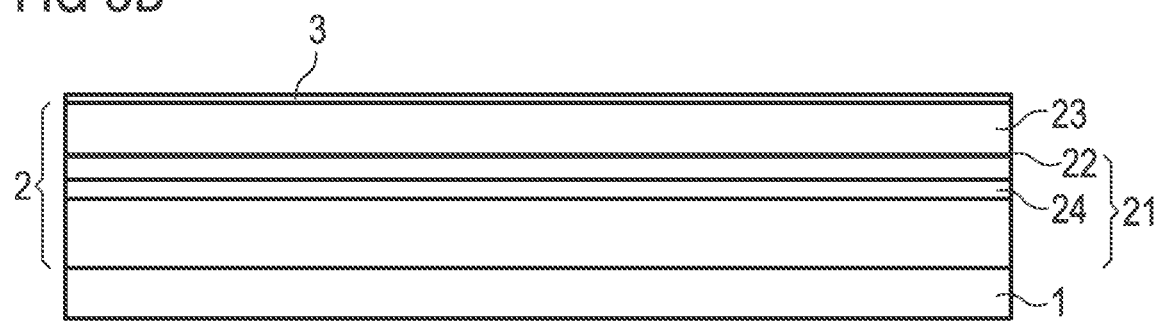

In the subsequent method step, FIG. 3B, the first current extension layer 3 is applied to the upper side of the second region 23 facing away from the substrate 1, which is, for example, a thin ITO layer. For example, the thickness of the first current extension layer 3 is at most 50 nm, in particular approximately 15 nm, for example.

Figure 3C:
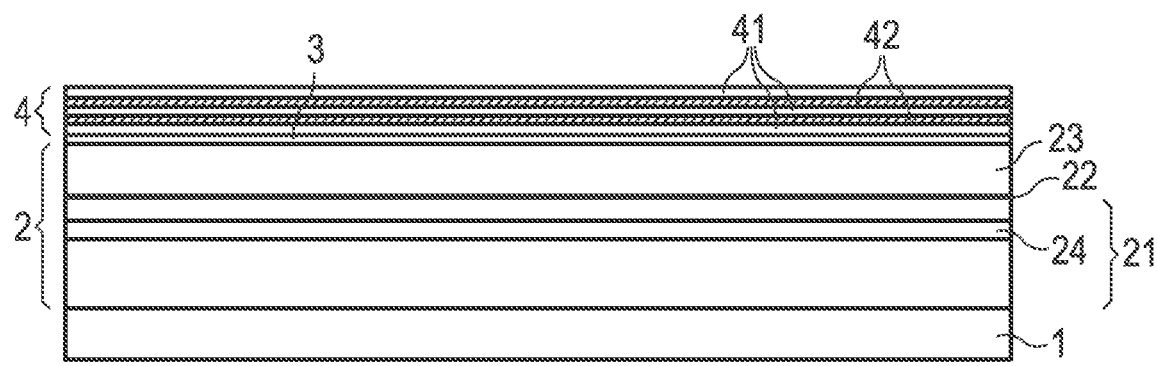

In the method step illustrated in connection with FIG. 3C, a dielectric mirror 4 is applied to the exposed outer surface of the first current extension layer 3, which comprises, for example, a multiplicity of first mirror layers 41 and second mirror layers 42, which may differ from each other in terms of their refractive index and their thickness.

Figure 3D:

Subsequently, FIG. 3D, the semiconductor body 2 is removed in places from the side facing away from the substrate 1 to below the connection layer 24. As described, for example, in connection with FIG. 1A to 1R, the ablation of the semiconductor body 2 in places can stop at an AlGaN layer which has a high aluminum concentration and a low gallium concentration.

Figure 3E:
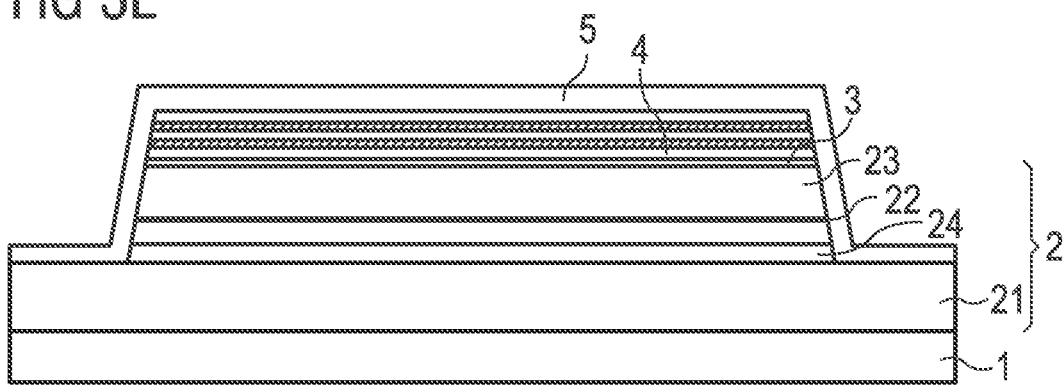

In the subsequent method step, FIG. 3E, a passivation 5 is applied as a layer to the arrangement of semiconductor body 2, first current extension layer 3 and dielectric mirror 4 facing away from the substrate 1 and is exposed.

Figure 3F:
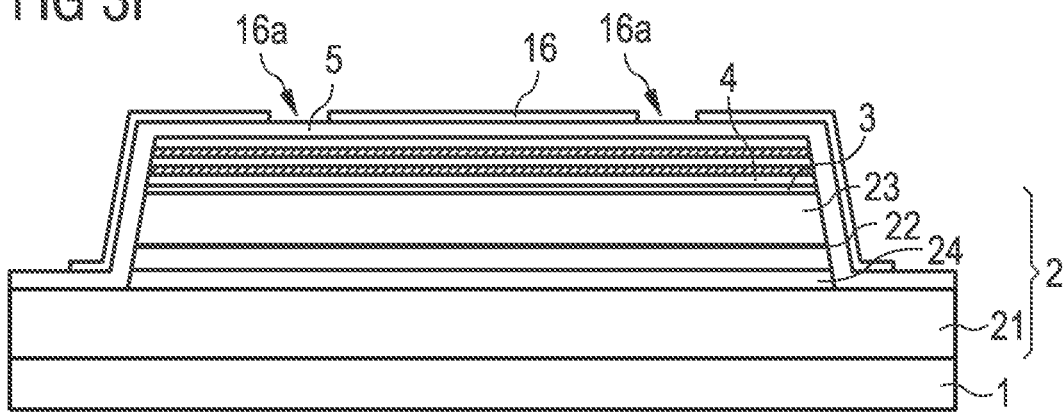

In contrast to the exemplary embodiment of the method described here in connection with FIG. 1A to 1R, in the subsequent method step, see FIG. 3F, involves the application of a further metallic mirror 16 on the side of the passivation 5 facing away from the substrate 1. The further metallic mirror 16, for example, is deposited by sputtering and subsequently structured. Furthermore, a structured deposition of the further metallic mirror 16 is possible by means of a mask layer.

The further metallic mirror 16 has openings 16a, on the upper side of the passivation facing away from the dielectric mirror 4, through which contact with the semiconductor body 2 is subsequently made. Furthermore, the further metallic mirror 16 is structured at the edges of each semiconductor chip to be produced in such a way that it does not extend to the edge, but is retracted, for example, at least 10 µm from the edge. This means, the trenches between the unstructured regions of the semiconductor body 2 are not completely covered by the material of the further metallic mirror 16, but the further metallic mirror 16, for example, is removed there in places.

Figure 3G:
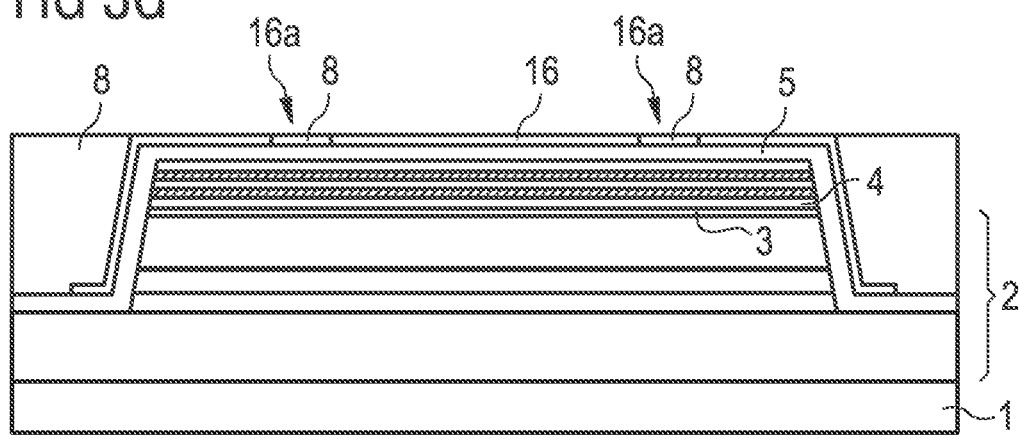

In the next method step, FIG. 3G, a planarization 8 is applied which can be produced, for example, with a metal such as nickel or an electrically insulating material such as $SiO_2$. The planarization 8 initially also covers the further metallic mirror 16 and is thinned, for example, by means of chemical-mechanical polishing, until the further metallic mirror 16 is exposed.

The further metallic mirror 16 is formed, for example, with aluminum or consists of aluminum, so that the exposure of the further metallic mirror 16 can be detected by the appearance of aluminum.

The openings in the further metallic mirror 16 on the side of the passivation facing away from the dielectric mirror 4 are filled with the material of the planarization 8, wherein the material of the planarization 8 in the openings flush with the other metallic mirror 16. This means, the openings 16a in the further metallic mirror 16 are, for example, completely filled with the material of the planarization 8.

Figure 3H:
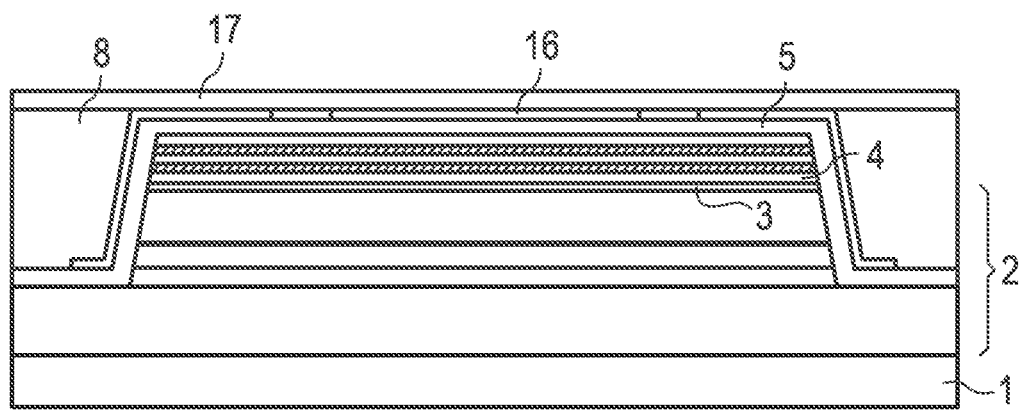

In the subsequent method step, FIG. 3H, a further passivation 17, which may be formed, for example, with $SiO_2$, is applied to the exposed surface of the arrangement facing away from the substrate 1. The further passivation 17 covers the planarization 8 and the further metallic mirror 16 and is in places in direct contact with these.

Figure 3I:
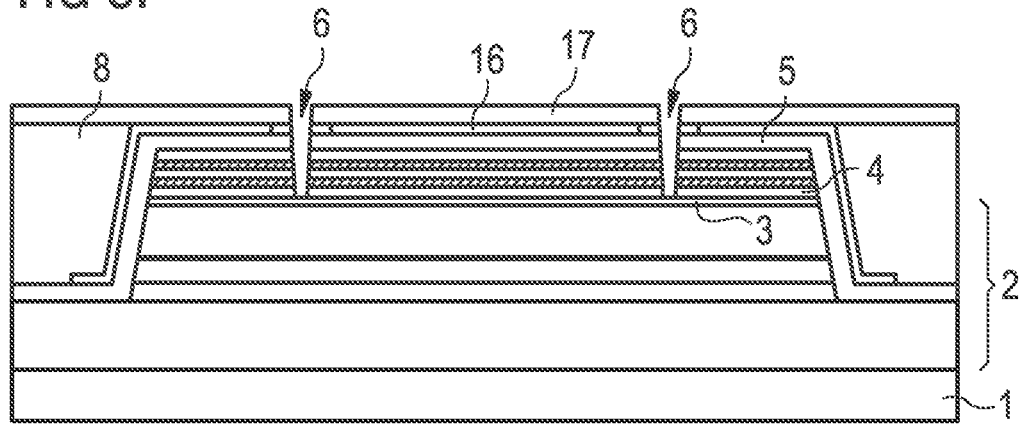

In the subsequent method step, FIG. 3I, the introduction of openings 6 takes place, which extend through the area of the openings 16a in the further metallic layer 16. The openings 6 extend from the upper side facing away from the substrate 1 to the first current extension layer 3. The openings 6 are generated, for example, by reactive ion etching, which selectively stops on the material of the first current extension layer 3, for example, ITO.

Figure 3J:
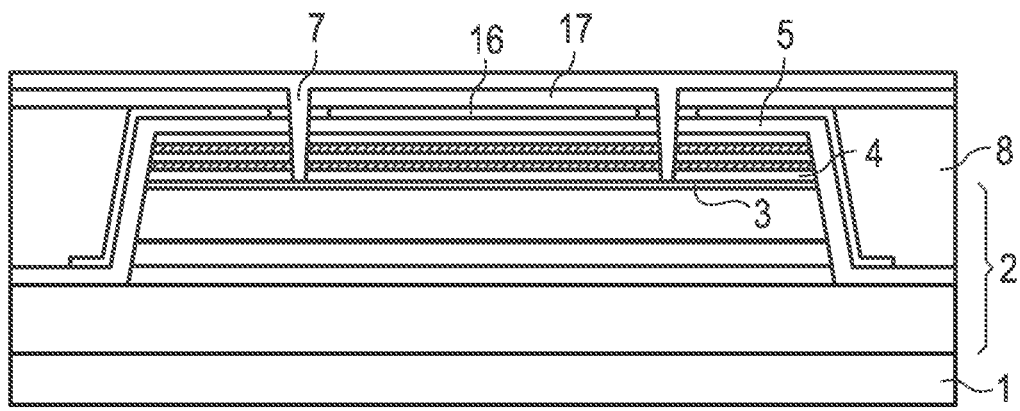

In the next method step, FIG. 3J, the application of a metallic mirror 7 takes place on the upper side of the further passivation 17 facing away from the further metallic mirror 16. The metallic mirror 7 can be formed, for example, with rhodium or with TiRh.

The metallic mirror 7 extends through the opening to the first current extension layer 3, where it contacts it electrically. In the case that the planarization is formed with an electrically conductive material such as nickel, it is possible that the side surfaces of the opening 6 are passivated by an insulating layer before the metallic mirror 7 is applied to prevent electrical contact between the metallic mirror 7 and the further metallic mirror 16.

Overall, the metallic mirror 7 is preferably arranged in such a way that it does not touch the further metallic mirror 16 and is not in electrically conductive contact with it.

Figure 3K:
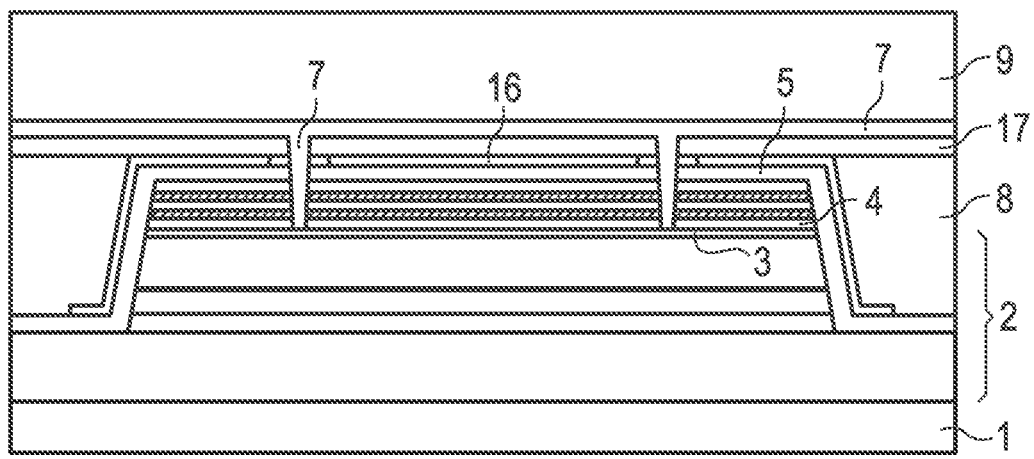
Figure 3L:
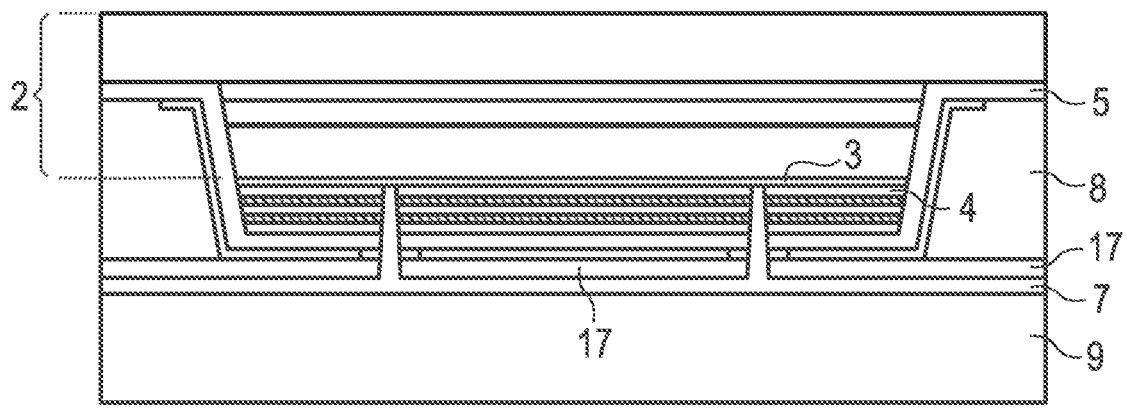

In the next method steps, see FIGS. 3K and 3L, a carrier 9, which can be formed, for example, with silicon, is applied to the side facing away from the substrate, and the substrate 1 is removed.

Figure 3M:
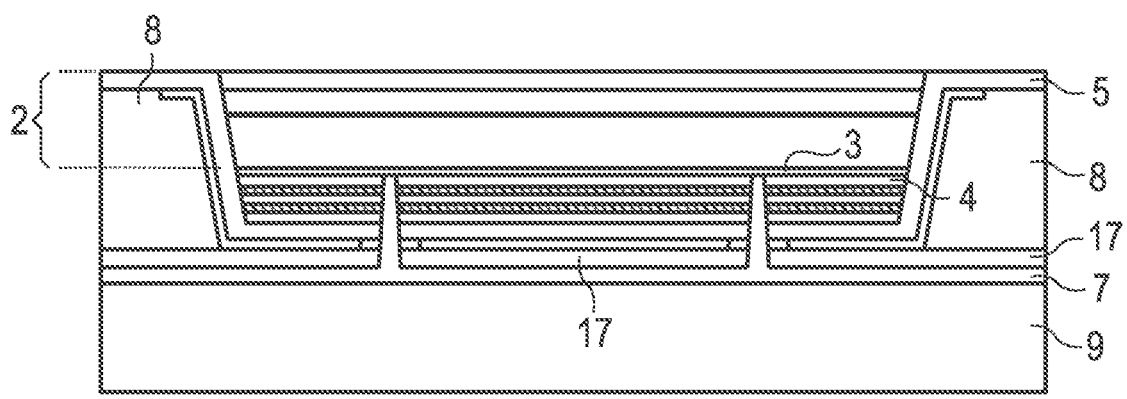

In the subsequent method step, FIG. 3M, the connection layer 24 is exposed from the side facing the substrate 1 before the substrate 1 is detached by removing a part of the first region 21. The exposure can take place as described in connection with FIG. 1L, for example.

Figure 3N:
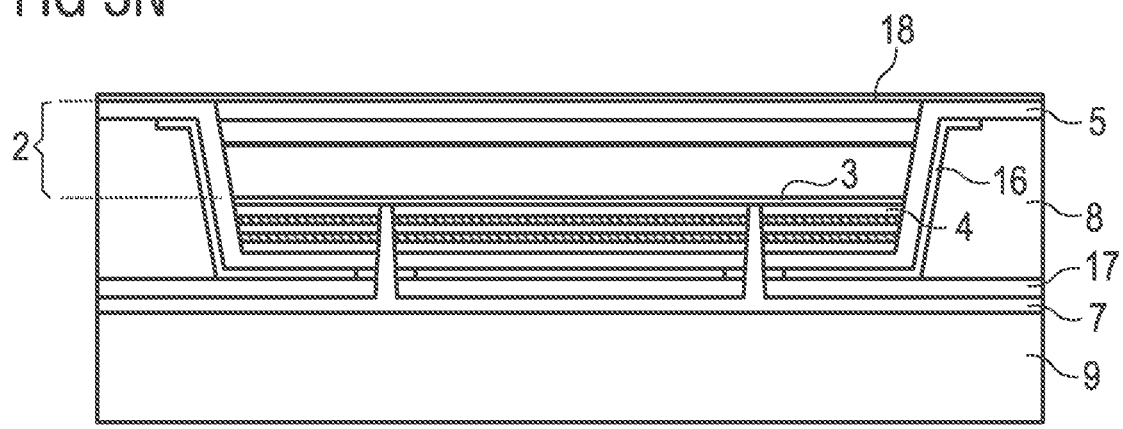

In connection with FIG. 3N, a method step is described in which an insulation 18 is applied, for example, by means of an ALD (Atomic Layer Deposition) method, to the exposed upper side facing away from the carrier 9.

Figure 3O:
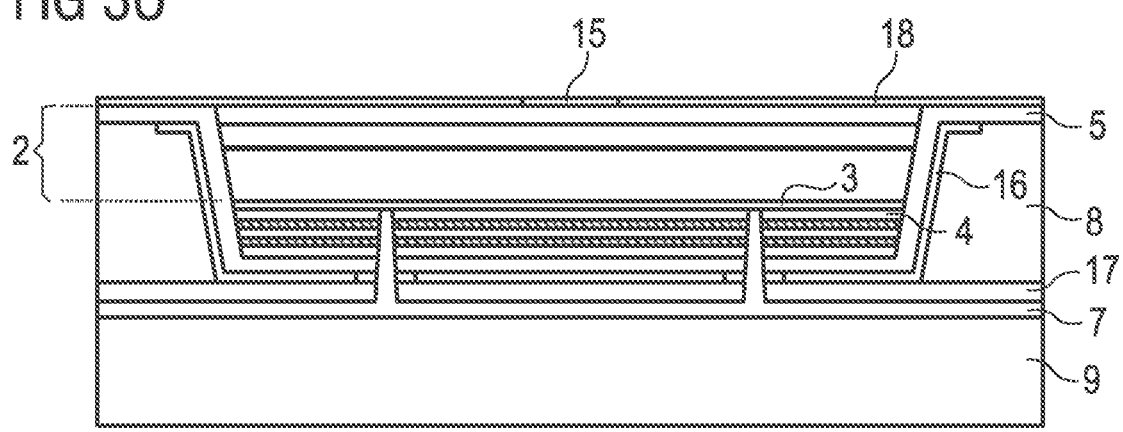

In connection with FIG. 3O, it is shown that the insulation 18 can be structured in order to deposit a metallic connection element 15, for example, which can be in direct contact with the connection layer 24 and, for example, serves for contacting the semiconductor chip on the n-side. The connection element 15 may, for example, be a bond pad designed for wire bonding.

In the subsequent method step, FIG. 3P, a decoupling layer 11 is formed, as described, for example, in connection with FIGS. 1N and 1P.

Overall, the light-emitting semiconductor chip of FIG. 3P results, which in addition to the dielectric mirror 4 and the metallic mirror 7 has a further metallic mirror 16, which is potential-free and is not contacted during operation of the light-emitting semiconductor chip. Rather, the further metallic mirror 16 is completely enclosed by electrically insulating material of the layers 8, 17 and 5. It is therefore advantageous to use a highly reflective material such as aluminum to form the further metallic mirror 16 without the migration of ions of the metal occurring during operation of the light-emitting semiconductor chip.

The light-emitting semiconductor chip, as shown in FIG. 3P, can be electrically contacted via the centrally arranged connection element 15. It can therefore be advantageous to dispense the second current extension layer 10 shown in connection with FIGS. 1 and 2, which can reduce the production effort. The disadvantage is that the centrally arranged connection element 15 is arranged on the light exit side 100*a* of the semiconductor chip and can therefore lead to shading and reflection of transmitted light.

However, it is possible to carry out the n-side contacting of the light-emitting semiconductor chip of the exemplary embodiment of FIG. 3P as an edge-side connection element 15, as illustrated, for example, in FIG. 1R. In addition, it is possible to use the central connection element 15 of FIG. 3P in the case of the light-emitting semiconductor chips described in connection with FIGS. 1R and 2P as an alternative to edge-side contacting. Moreover, it is also possible to use the further metallic mirror 16 in the embodiment of FIG. 2, in which the passivation 5 is replaced by the dielectric mirror 4.

The invention is not limited by the description based on the embodiments of these. Rather, the invention encompasses any novel feature as well as any combination of features, which includes in particular any combination of features in the patent claims, even if this feature or combination itself is not explicitly stated in the patent claims or exemplary embodiments.

The invention claimed is:

1. A light-emitting semiconductor chip comprising:
   a semiconductor body comprising an active region designed to generate light;
   a dielectric mirror comprising an electrically insulating material;
   a first metallic mirror comprising an electrically conductive material, and
   a second metallic mirror arranged, in places, between the dielectric mirror and the first metallic mirror,
   wherein the semiconductor body expands towards a light exit side,
   wherein the dielectric mirror is arranged on a side of the semiconductor body facing away from the light exit side,
   wherein the first metallic mirror is arranged on a side of the dielectric mirror facing away from the semiconductor body,
   wherein the first metallic mirror electrically contacts the semiconductor body through at least one opening in the dielectric mirror,
   wherein the dielectric mirror, apart from the at least one opening, completely covers the semiconductor body on the side facing away from the light exit side, and
   wherein the first metallic mirror extends, in places, through the second metallic mirror to the semiconductor body.

2. The light-emitting semiconductor chip according to claim 1,
   wherein the dielectric mirror comprises a plurality of first mirror layers and second mirror layers, and
   wherein the first mirror layers and the second mirror layers differing from each other with respect to their refractive index.

3. The light-emitting semiconductor chip according to claim 1, further comprising a first current extension layer arranged between the semiconductor body and the dielectric mirror, wherein the first current extension layer completely covers the semiconductor body on the side facing away from the light exit side, and wherein the first current extension layer terminates flush with the semiconductor body in lateral directions.

4. The light-emitting semiconductor chip according to claim 3, wherein the dielectric mirror is in direct contact with the first current extension layer.

5. The light-emitting semiconductor chip according to claim 1, further comprising a planarization completely surrounding the semiconductor body in lateral directions, wherein the planarization along a vertical direction has a thickness greater than a thickness of the semiconductor body along the vertical direction.

6. The light-emitting semiconductor chip according to claim 1, wherein the semiconductor body is completely surrounded on the light exit side in the lateral directions by an electrically insulating material and is flush with the electrically insulating material or is projected by the electrically insulating material in a vertical direction.

7. The light-emitting semiconductor chip according to claim 6, wherein the electrically insulating material is a part of the dielectric mirror and / or a part of a passivation.

8. The Light-emitting semiconductor chip according to claim 1, further comprising a connection element for electrically contacting the active region surrounding the semiconductor body in lateral directions, wherein the connection element is arranged laterally spaced apart from the semiconductor body.

9. The light-emitting semiconductor chip according to claim 8, wherein the connection element is arranged on a side of an electrically insulating material facing away from a carrier for the semiconductor body.

10. Light-emitting semiconductor chip according to claim 1, wherein the second metallic mirror is potential-free in operation of the light-emitting semiconductor chip.

* * * * *